United States Patent
Schwindt et al.

(10) Patent No.: US 11,841,404 B1
(45) Date of Patent: Dec. 12, 2023

(54) VECTOR MEASUREMENTS USING A PULSED, OPTICALLY PUMPED ATOMIC MAGNETOMETER

(71) Applicant: National Technology & Engineering Solutions of Sandia, LLC, Albuquerque, NM (US)

(72) Inventors: Peter Schwindt, Albuquerque, NM (US); Joonas Aleksanteri Iivanainen, Albuquerque, NM (US); Tony Ray Carter, Albuquerque, NM (US); Amir Borna, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/875,500

(22) Filed: Jul. 28, 2022

Related U.S. Application Data

(60) Provisional application No. 63/230,901, filed on Aug. 9, 2021.

(51) Int. Cl.
*G01R 33/032* (2006.01)

(52) U.S. Cl.
CPC ............... *G01R 33/0322* (2013.01)

(58) Field of Classification Search
CPC .................................................. G01R 33/0322
USPC ....................................................... 324/631
See application file for complete search history.

(56) References Cited

U.S. PATENT DOCUMENTS

| | | | |
|---|---|---|---|
| 6,593,884 B1* | 7/2003 | Gilboa | A61B 5/062 342/450 |
| 8,212,556 B1 | 7/2012 | Schwindt et al. | |
| 9,995,800 B1 | 6/2018 | Schwindt et al. | |
| 2007/0167723 A1* | 7/2007 | Park | G01R 33/032 600/409 |
| 2011/0001478 A1* | 1/2011 | Wemmer | G01R 33/0322 324/309 |

(Continued)

OTHER PUBLICATIONS

Xu, Zhengyi, et al. "Measuring the enhancement factor of the hyperpolarized Xe in nuclear magnetic resonance gyroscopes." Physical Review A 103.2 (2021): 023114. (Year: 2021).*

(Continued)

*Primary Examiner* — Christopher P McAndrew
(74) *Attorney, Agent, or Firm* — Mark A. Dodd

(57) ABSTRACT

An atomic magnetometer, and a method for using same is disclosed. The method for measuring an ambient magnetic field uses an atomic magnetometer that has a probe light beam with a probe axis that probes a polarization vector of an atomic population confined within a vapor cell. The method employs one or more measurement cycles. In each measurement cycle, the polarization vector is prepared in an initial state via an optical pumping pulse. The vapor cell is then subjected to the ambient magnetic field, which results in rotation of the polarization vector by Larmor precession. Within the measurement cycle, at a point in time after the polarization vector has been prepared in the initial state, the ambient magnetic field rotates the direction of the polarization vector, and at least one measurement is made of a projection of the Larmor-rotated polarization vector onto the probe axis during or after application of a magnetic waveform.

16 Claims, 11 Drawing Sheets

(56) References Cited

U.S. PATENT DOCUMENTS

2012/0313634 A1* 12/2012 Parks ................ G01R 33/0322
324/244.1
2013/0120882 A1* 5/2013 Love ........................ H02H 3/33
361/42
2014/0306700 A1* 10/2014 Kamada ............. G01R 33/0322
324/244.1

OTHER PUBLICATIONS

Seltzer, S. J. and Romalis, M. V., "Unshielded three-axis vector operation of a spin-exchange-relaxation-free atomic magnetometer," Applied Physics Letters, vol. 85, No. 20 (2004), pp. 4804-4806.

Sheng, D. et al., "Subfemtotesla Scalar Atomic Magnetometry Using Multipass Cells," Physical Review Letters, vol. 110 (2013), pp. 160802-1-160802-5.

Zhivun, E. et al., Dual-Axis π-Pulse Magnetometer with Suppressed Spin-Exchange Relaxation, Physical Review Applied, vol. 11 (2019), pp. 034040-1-03404-9.

* cited by examiner

VECTOR MEASUREMENTS USING A PULSED, OPTICALLY PUMPED ATOMIC MAGNETOMETER

RELATED APPLICATIONS

This application claims priority to U.S. Provisional Application No. 63/230,901, filed on Aug. 9, 2021, and entitled VECTOR MEASUREMENTS USING A PULSED, OPTICALLY PUMPED ATOMIC MAGNETOMETER, the entirety of which is incorporated herein by reference.

STATEMENT OF GOVERNMENT INTEREST

This invention was made with Government support under Contract No. DE-NA0003 525 awarded by the United States Department of Energy/National Nuclear Security Administration. The Government has certain rights in the invention.

TECHNICAL FIELD

The present invention relates generally to magnetometers, and more particularly to atomic magnetometers that operate by optically probing an optically polarized alkali metal vapor and methods for their use.

BACKGROUND

High-sensitivity detection of ambient magnetic fields is important in various applications, including ordinance detection, geophysical mapping, navigation, and the detection of bio-magnetic fields associated with heart and brain activity.

Conventional superconducting magnetometers based on superconducting quantum interference devices (SQUIDs) provide a high sensitivity for ambient magnetic field detection, but they are bulky and require expensive cryogenic cooling. An alternative approach that is currently in development uses atomic magnetometers, which are typically based on optical measurements of the unpaired electron spin in an alkali metal atom or the like. These atomic magnetometers do not require cryogenic cooling. They are capable of measuring the magnitude of an ambient magnetic field or a vector component of the field at high sensitivities, for example sensitivities of less than 1 fT/rt-Hz. In this regard, a magnetometer that measures only the magnitude of the ambient magnetic field is generally referred to as a "scalar" magnetometer, whereas a magnetometer that can measure one or more vector components of the ambient magnetic field is generally referred to as a "vector" magnetometer.

An example of an atomic magnetometer is provided in U.S. Pat. No. 8,212,556, commonly owned herewith, which issued to P. Schwindt and C. N. Johnson on Jul. 3, 2012, under the title, "Atomic Magnetometer," and which is incorporated herein by reference in its entirety. Another example is provided in U.S. Pat. No. 9,995,800, commonly owned herewith, which issued to P. Schwindt, C. N. Johnson, and Y.-Y. Jau on Jun. 12, 2018, under the title, "Atomic Magnetometer with Multiple Spatial Channels," and which is incorporated herein by reference in its entirety.

U.S. Pat. No. 8,212,556 provided an atomic magnetometer in which a pump light beam and a probe light beam are directed in substantially the same direction, referred to herein as the z-direction, through an alkali metal vapor cell. In that arrangement, the magnetometer is operated at zero field, and, by utilizing applied magnetic field modulation, it can sense ambient magnetic field components at arbitrary angles in the plane orthogonal to the z-direction. By contrast, other types of zero-field atomic magnetometers, in which the pump light beam is orthogonal to the probe light beam, are typically limited to sensing an ambient magnetic field in a single direction orthogonal to the pump and probe light beams. However, applied magnetic field modulation can be used to operate such a magnetometer as a three-dimensional vector magnetometer. Such an approach is described, for example, in S. J. Seltzer and M. V. Romalis, "Unshielded three-axis vector operation of a spin-exchange-relaxation-free atomic magnetometer," Applied Physics Letters, vol. 85, pp. 4804-4806 (2004), which is incorporated herein by reference in its entirety.

The magnetometer of U.S. Pat. No. 8,212,556 utilized two different wavelengths for the pump and probe light beams. This arrangement allowed the pump light beam to be blocked by an optical filter while allowing the probe light beam to be transmitted through the optical filter to a detector for sensing the spin polarization and, thereby, the magnetic field. The pump and probe light beams were deliverable by either free-space or fiber optic transport. Hence, the lasers used to generate the pump and probe light beams could be placed some distance away from the vapor cell of the atomic magnetometer.

In implementations described in U.S. Pat. No. 8,212,556, the vapor cell contains an alkali metal vapor, e.g., a vapor of sodium, potassium, rubidium, or cesium. The pump and probe light beams have wavelengths that substantially coincide with respective D-line atomic transitions of the alkali metal vapor.

The pump light beam, which is initially linearly polarized, is directed through a wave plate to convert it to circular polarization. The pump light beam is then directed through the vapor cell to spin polarize the alkali metal vapor. The linearly polarized probe light beam is also directed through the vapor cell. Within the vapor cell, the probe light beam undergoes a change in polarization due to Faraday rotation caused by the magnetic interaction between the probe light beam and the polarized atomic vapor. On exiting the vapor cell, the probe light beam impinges a photodetection system, which responds by generating an electrical signal indicative of a change in the polarization of the probe light beam.

The electrical output signal provides the desired measure of the ambient magnetic field in the vapor cell, i.e., of the contribution to the total magnetic field arising from sources external to the magnetometer. As noted, this measurement is sensitive only to ambient magnetic field components that lie in the plane perpendicular to the z-direction, i.e., to the optical axis of the magnetometer, along which the pump and probe light beams propagate through the vapor cell.

More recent advances attest to the continuing importance of optically pumped atomic magnetometry. For example, E. Zhivun et al., "Dual-Axis it-Pulse Magnetometer with Suppressed Spin-Exchange Relaxation," Physical Review Applied, vol. 11, art. no. 034040 (2019), which is incorporated herein by reference in its entirety, presents a method for using a single probe light beam to measure ambient magnetic field components on both axes orthogonal to the pump light beam propagation axis, and the described method uses synchronous detection to reduce noise.

In their approach, Zhivun et al. apply a controlled magnetic field to the vapor cell along the pump light beam propagation axis, which is orthogonal to the probe propagation axis. The applied magnetic field is a dc offset field superposed with a comb of $\pi$ pulses. A $\pi$ pulse, in this regard, is a magnetic pulse devised to rotate the polarization vector P of the spin-polarized atomic vapor through $\pi$ radians by Larmor precession. (Likewise, π/2 pulse would rotate the polarization vector through π/2 radians.)

The Zhivun et al. device responds to the respective sensed ambient magnetic field components with mutually orthogonal output signals that are periodic at the π-pulse frequency and that are indicative of how much the probe polarization has been rotated. The signal demodulation for each axis is performed by multiplying the output signal by an appropriately phased square wave at the it-pulse frequency, followed by low-pass filtering.

Another example is provided by D. Sheng et al., "Subfemtotesla Scalar Atomic Magnetometry Using Multipass Cells," Physics Review Letters, vol. 110, art. no. 160802 (2013), which is incorporated herein by reference in its entirety. Sheng et al. present a scalar magnetometer that measures the magnitude of the ambient magnetic field vector. In the approach of Sheng et al., the ambient magnetic field is nominally collinear or anti-collinear to the pump light beam direction, which is orthogonal to the probe light beam direction.

In the measurement sequence, the pump light beam is pulsed on to spin-polarize the atoms. A pulsed radiofrequency (RF) field at the Larmor precession frequency resonantly drives a π/2 RF pulse in the optically polarized atomic vapor. This is followed by two probe pulses separated by a specified time delay. The optical polarization-rotation signal is sinusoidal during the application of a pulse probe. The ambient magnetic field strength is inferred from the positions of the zero crossings in the rotation-signal waveforms, taking the difference in time between zero crossings in the first and second probe pulses.

Although there has been significant progress in the technology of atomic magnetometry, there is still a need for further improvements. Some of the remaining challenges relate to desirable characteristics such as compact optical design, sensitivity to extremely low ambient magnetic fields, and vector operation, in which all components of the ambient magnetic field can be measured.

SUMMARY

We have devised a new mode for operating an optically pumped atomic magnetometer. In our new mode, the magnetometer is operated at near-zero magnetic field. No bias field is required. The only low-frequency magnetic field that is present is, ideally, the ambient magnetic field that is to be measured. The new mode of operation is well suited for magnetoencephalography and other applications where extremely high sensitivity is needed.

In a broad sense, our new approach combines the use of a pulsed pump light beam for state preparation with subsequent low-field measurements. The atomic vapor is initially prepared with a polarization vector parallel to the pump light beam axis. What is measured is the resulting precession of the polarization vector due to an ambient magnetic field. In principle, this precession could be detected directly by a probe light beam propagating in a direction orthogonal to the pump light beam axis. As explained below, however, we have developed an approach in which an applied magnetic field rotates the polarization vector, obviating any need for orthogonality between the pump and probe light beam axes and allowing any or all vector components of the field to be measured. While collinear or orthogonal pump and probe light beams have certain advantages, other angular configurations of the pump and probe light beams that overlap in the atomic vapor are possible.

In embodiments, we use a laser pulse, typically 10-500 µs in width, to rapidly pump the atomic vapor to a state of nearly complete polarization along the pump light beam axis, which is here referred to as the z-axis. This is followed by a measurement phase, typically of 1-10 ms, during which the pump light beam is turned off.

In an illustrative example, the pump and probe light beams are collinear along the z-axis. The probe light beam is sensitive only to the component of the atomic polarization along its own propagation axis. When an extremely weak ambient magnetic field is to be measured, it will be necessary to detect a very small rotation that leaves the atomic polarization vector close to its initial direction, with only a very small component orthogonal to the initial direction. To make the measurements as sensitive as possible, that small component should be made to lie along the probe light beam axis, which is exemplarily in the z-direction. To achieve that, it is necessary to rotate the initial polarization vector, by Larmor precession, into the xy-plane prior to a Faraday rotation measurement with the probe light beam, i.e., a measurement of the rotation of the optical polarization due to the component of the atomic polarization parallel to the propagation axis of the probe light beam.

Although in the preferred embodiment the pump and probe light beams are collinear, it should be noted that the pump and probe light beams do not necessarily have to be collinear. For example, the probe light beam can be slightly offset from the pump light beam to facilitate separating the pump light beam from the probe light beam. The probe light beam could, in fact, propagate in any direction, although the least complication would emerge for propagation along the x-, y-, or z-axis, when the pump light beam is along the z-axis, i.e., the pump and probe light beams are either collinear or orthogonal.

The Larmor precession can be driven by short magnetic field pulses. In an example, an applied magnetic π/2 pulse rotates the polarization vector from its initial z-direction to a new direction in the xy-plane. Measurements of the spin polarization are then made using either a continuous probe light beam or a series of optical probe pulses.

Additionally, it can be advantageous to apply a modulation technique that enables lock-in detection to reduce low-frequency noise. In an example modulation technique, the direction of the polarization vector is repeatedly reversed using a periodic, bipolar train of applied magnetic 7C pulses. In another example, reversals of the polarization vector are driven by a sinusoidal modulation waveform. In this example as well, lock-in detection can be employed for noise reduction.

Although both of the above examples have advantages, the scheme using short applied magnetic field pulses is expected to offer the highest sensitivity, because the atomic polarization spends a greater fraction of each modulation period orthogonal to the probe laser and the probe laser is most sensitive to changes in atom polarization in this geometry.

The torque τ exerted on a magnetic dipole of dipole moment µ by a magnetic field B is given by the well-known formula τ=µ×B, where the symbol "×" designates the vector cross product. As a consequence, each measurement interval will accrue atomic polarization rotation along at most two orthogonal axes, i.e., the two axes that are orthogonal to the atomic polarization direction. No polarization rotation will be accrued along the direction of the atomic polarization.

We have found that a fully three-dimensional vector measurement can be made of the ambient magnetic field. To achieve that, however, it is necessary to make at least three individual measurements of the spin polarization component along the z-axis. In order for those individual measurements to acquire complementary information, as required, the polarization vector must be rotated by a known, applied magnetic field, typically an applied magnetic $\pi/2$ pulse, between individual measurement intervals. Each individual measurement then probes a change in polarization that has accrued along the z-axis or that has accrued on a different axis and has been rotated onto the z-axis.

Accordingly, the invention relates to a method of measuring an ambient magnetic field B with an atomic magnetometer of the kind in which a probe light beam having a probe axis probes a polarization vector P of an atomic population confined within a vapor cell. There are one or more measurement cycles, in each of which the polarization vector P is prepared in an initial state, the vapor cell is subjected to an ambient magnetic field B, which causes the polarization vector P to be rotated by Larmor precession, and at least once, a measurement is made of the projection of the Larmor-rotated polarization vector P onto the probe axis.

Also within each measurement cycle, a magnetic waveform is applied to the vapor cell after the preparing of the polarization vector P in an initial state. This waveform causes the direction of the polarization vector P to be rotated. At least one of the projection measurements within each measurement cycle is made during or after the applying of the magnetic waveform.

The projection measurements are made by the probe light beam. In some embodiments, they are continuous measurements made by the probe light beam in continuous operation, whereas in other embodiments, they are discrete measurements made by the probe light beam in pulsed operation.

In some embodiments, the magnetic waveform is constituted, at least in part, by one or more applied magnetic $\pi/2$ pulses having the property of rotating the polarization vector P by 90°. In other embodiments, the magnetic waveform is constituted by a continuous, sinusoidally modulated magnetic field. Sinusoidal modulation can generate a modulated data stream that, in embodiments, can be demodulated to provide output data.

In some embodiments, one or more magnetic $\pi/2$ pulses are applied to the vapor cell after the preparing of the polarization vector P in an initial state, and then at least one projection measurement is made after one of the magnetic $\pi/2$ pulses has been applied. In some such embodiments, after an applied magnetic $\pi/2$ pulse, a first projection measurement is made, a magnetic $\pi$ pulse is applied to the vapor cell so as to rotate the polarization vector P through 180° about an axis orthogonal to the probe axis, and then a second projection measurement is made.

By performing the method over a plurality of measurement cycles, for example, the first and second projection measurements can generate a modulated data stream. Thus, embodiments, of the method further comprise demodulating such a modulated data stream.

In embodiments, the polarization vector P is prepared in an initial state by polarizing the atomic population with a pump light beam. In some embodiments, the pump and probe light beams are collinear. In embodiments, the results of the projection measurements are numerically processed, for example, by a numerical processor, to obtain values for one, two, or for all three, orthogonal components of the ambient magnetic field B.

In an example measurement cycle according to some embodiments, the polarization vector P is prepared in the initial state and then rotated by at least two applied magnetic $\pi/2$ pulses. One applied magnetic $\pi/2$ pulse is followed by a first projection measurement, and a second applied magnetic $\pi/2$ pulse is followed by at least one further projection measurement. For example, second and third further projection measurements may be made sequentially, with application of the second magnetic $\pi/2$ pulse after the second projection measurement but before the third projection measurement. In such a measurement sequence, the first magnetic $\pi/2$ pulse may be applied, e.g., so as to rotate the polarization vector P through 90° about an axis orthogonal to the probe axis, and the second magnetic $\pi/2$ pulse may be applied so as to rotate the polarization vector P through 90° about an axis orthogonal to both the initial rotation axis and the probe axis.

The invention further relates to an atomic magnetometer that implements the above methods of measuring an ambient magnetic field B.

Features from any of the disclosed embodiments may be used in combination with one another, without limitation. In addition, other features and advantages of the present disclosure will become apparent to those of ordinary skill in the art through consideration of the following detailed description and the accompanying drawings.

BRIEF DESCRIPTION OF THE DRAWINGS

The drawings illustrate several embodiments of the invention, wherein identical reference numerals refer to identical or similar elements or features in different views or embodiments shown in the drawings. The drawings are not to scale and are intended only to illustrate the elements of various embodiments of the present invention.

DETAILED DESCRIPTION

Before embarking on a detailed discussion, we will first briefly summarize the design and operative principles of an atomic magnetometer (AM) that is described here for illustration only and not for purposes of limitation. The AM senses magnetic fields by interrogating the interaction of the electronic spins of alkali atoms contained within a glass vapor cell with a magnetic field using a near-resonant laser field.

The magnetic response of an atomic vapor is maximized by passing a circularly polarized pump light beam through the vapor to align nearly all of the electron spins. Such optical pumping greatly enhances the sensitivity because the signals from all the atoms add coherently.

The collective response of the atoms to the magnetic field results in a change in the index of refraction of the atomic gas, which is measured by detecting the optical rotation of a linearly polarized probe light beam. Alternatively, the dichroic atomic absorption of the vapor can be measured with circularly polarized light. This scheme of rotation measurement can be used to measure ambient magnetic field components that are perpendicular to the optical axis of the magnetometer, i.e., to the direction in which the pump and probe light beams, which are collinear, propagate through the vapor cell.

The AM utilizes the atomic fine structure of an alkali metal. In a particular illustrative approach using a rubidium atomic vapor, a pump light beam pumps the atoms with the rubidium D1 line at 795 nm and a probe light beam probes the atoms with the rubidium D2 line at 780 nm. The polarizations of the pump and probe light beams are controlled by a dichroic waveplate which is dimensioned so as to convert the D1 light, which is initially linearly polarized, into a circularly polarized beam while maintaining the linear polarization of the D2 probe light beam.

After the pump and probe light beams have propagated through the vapor cell, changes in the angle of polarization of the probe light beam are measured by directing the probe light beam into a polarization analyzer and from there to paired photodetectors for balanced detection. Prior to detection, the pump light beam is removed from the detected beam by an optical line filter.

Figure 1:
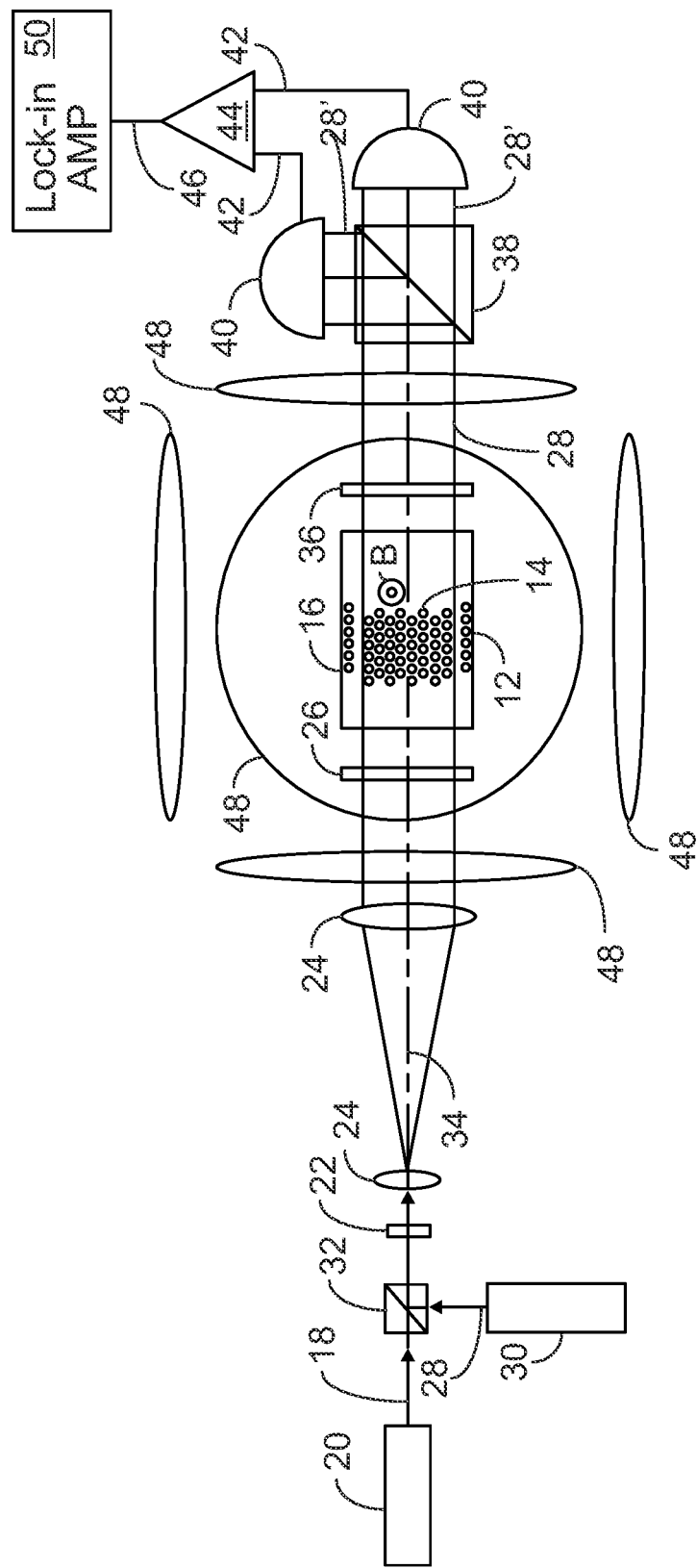
FIG. 1 is a schematic drawing of an atomic magnetometer of the prior art.

FIG. 1 is a schematic diagram of an example of an atomic magnetometer 10 for sensing a magnetic field according to a description in U.S. Pat. No. 8,212,556. The example of FIG. 1 is to be understood as illustrative only, and not as limiting.

An atomic magnetometer 10 comprises a vapor cell 12 containing an alkali metal vapor 14. The vapor cell 12, which can be made of glass, can also include a buffer gas 16 comprising, e.g., a noble gas such as helium or neon. Another gas such as nitrogen can also be added to the buffer gas 16. The vapor cell 12 can be heated to an elevated temperature to provide a density of alkali metal atoms in the alkali metal vapor 14 which can range from about $10^{11}$ cm$^{-3}$ to $10^{15}$ cm$^{-3}$ or more.

The exact temperature to which the vapor cell 12 is heated will depend, in general, upon the particular alkali metal used. When the alkali metal comprises rubidium-87, for example, the vapor cell 12 can be heated up to about 200° C. The vapor cell 12 is typically heated by locating the vapor cell 12 within an oven. The oven has been omitted from FIG. 1 to better show other details of the atomic magnetometer 10.

In the atomic magnetometer 10, a pump light beam 18 is generated by a laser 20 and directed through a linear polarizer 22. The linear polarizer 22 can be omitted if the pump light beam 18 is already linearly polarized by the laser 20. The pump light beam 18 can have an optical power level of up to a few milliwatts (mW) or more, depending upon the size of the vapor cell 12. The pump light beam 18 is expanded and collimated by one or more lenses 24. The pump light beam 18 is advantageously expanded to a beam diameter that substantially fills the internal volume of the vapor cell 12. The lateral dimensions of the vapor cell 12 are typically about 25 mm or smaller, but could also be substantially greater.

Downstream of the lenses 24, the pump light beam 18 passes through an optical waveplate 26, which is configured as a quarter waveplate at the pump wavelength. The waveplate 26 converts the initially linear polarized pump light beam 18 to circular polarization.

Downstream of optical waveplate 26, the pump light beam 18 passes through the vapor cell 12, containing the alkali metal vapor 14.

As noted above, the pump light beam 18 is tuned, in particular examples, to a D1 transition and the probe light beam is tuned, in particular examples, to a D2 transition. A D1 atomic transition is a transition from a $n^2S_{1/2}$ ground state to a $m^2P_{1/2}$ excited state of an alkali metal atom, where n and m are integers. A D2 transition is a transition from a $n^2S_{1/2}$ ground state to a $m^2P_{3/2}$ excited state. As also noted above, the rubidium D1 transition is at 795 nm, and the rubidium D2 transition is at 780 nm.

The spectral lines corresponding to the D1 and D2 transitions have Voigt line shapes which, as is well known, approach Lorentzian line shapes at high pressures of the buffer gas. Due to pressure broadening, the full width at half-maximum (FWHM) of each spectral line can range up to 10-20 GHz. The probe light beam need not be tuned to the exact center of the D1 or D2 spectral line; instead, it can be detuned toward the wings of the spectral line by up to several hundred gigahertz. Such detuning can be useful to reduce absorption by the alkali metal vapor 14. The pump light beam 18 can likewise be detuned by up to several tens of gigahertz, although this may not be necessary for a pump source of sufficient power.

According to the nomenclature adopted here, a pump or probe wavelength is said to be substantially equal to the wavelength of a D-line transition if it is close enough to the D1 or D2 transition to interact with the alkali metal vapor 14. In the case of the pump light beam 18, the interaction that is meant will result in the alkali metal vapor 14 absorbing at least some energy from the pump light beam 18. In the case of the probe light beam 28, the interaction that is meant will result in the alkali metal vapor 14 undergoing a change in refractive index, which produces a Faraday rotation of the probe light beam 28.

The optical pumping of the alkali metal vapor 14 by the circularly polarized pump light beam 18 reorients the spins of the individual alkali metal atoms so that they are in a magnetically polarized state with the spin of each alkali metal atom aligned along the z-axis, i.e., along the direction of the pump light beam 18. The alkali metal atoms located outside of the pump light beam 18 will remain largely randomly polarized, although the atoms tend to diffuse out of the pump light beam 18 while maintaining their polarization for the coherence time of the polarization.

In implementations, buffer gas 16 includes a noble gas such as helium or neon. In other implementations, it is constituted by pure nitrogen. The buffer gas is used to suppress collisions between the alkali metal atoms and the inner walls of the vapor cell 12. This is desirable because the wall collisions tend to randomize the spins of the alkali metal atoms.

A noble gas buffer typically has a partial pressure of about 60-100 kPa. Added nitrogen can be useful to quench the $n^2P_{1/2}$ or $n^2P_{3/2}$ excited state of the alkali metal atoms. Quenching of these states is useful to relax the atoms back into the magnetically polarized $n^2S_{1/2}$ ground state at a more rapid rate without reemitting the absorbed light, preventing radiation trapping. When added to a noble gas buffer, the nitrogen has a typical partial pressure of about 4 kPa.

FIG. 1 shows an ambient magnetic field B pointing in a direction substantially perpendicular to the plane of FIG. 1. However, those skilled in the art will understand that the ambient magnetic field B can be oriented in any direction, and the particular components measured will be determined by the applied magnetic $\pi/2$ or $\pi$ pulses or, alternatively, by the conditions of an applied sinusoidal modulation scheme.

The atomic magnetometer 10 detects the rotation of the alkali metal atom spins in the alkali metal vapor 14 by using a probe light beam 28 from a laser 30. As noted above, the probe light beam 28, in specific examples, is tuned to a D2 transition when the pump light beam 18 is tuned to a D1 transition. The optical power level of the probe light beam 28 can be up to a few milliwatts or more.

The lasers 20 and 30 used to generate the pump and probe light beams 18 and 28 can be, for example, broad area diode lasers, distributed feedback (DFB) lasers, or vertical-cavity surface emitting lasers (VCSELs). Those skilled in the art will understand that other types of lasers or other light sources can be used to generate the pump and probe light beams 18 and 28, including other types of alkali vapor lamps, semiconductor lasers, titanium sapphire lasers, and organic dye lasers.

The probe light beam 28 is combined onto a common axis with the pump light beam 18 by an optical beam-combining element 32. In the example of FIG. 1, the optical beam-combining element 32 is a polarizing beamsplitter. Alternative optical beam-combining elements include, e.g., beamsplitters, dichroic beamsplitters, mirrors, prisms, diffraction gratings, and optical fiber couplers. The probe light beam 28 follows the optical path 34 of the pump light beam 18 through the linear polarizer 22, the lenses 24, the optical waveplate 26, and the vapor cell 12.

The optical waveplate 26 is configured to operate at the probe wavelength as a full or half waveplate, either of which maintains the probe light beam 28 in a linear polarization state. Whereas a full waveplate does not rotate the plane of polarization, a half waveplate rotates the plane of polarization by 90°.

As noted above, the waveplate 26 serves both as a quarter-wave plate at the pump wavelength and as a half-wave plate at the probe wavelength. Such a dual purpose will generally entail the use of a high-order optical waveplate 26. By way of illustration, an example waveplate 26 for a 795-nm pump light beam 18 and a 780-nm probe light beam 28 is made of crystalline quartz with a thickness of 1.09 mm. This provides an optical retardation of 12.25 waves at 795 nm and an optical retardation of 12.5 waves at 780 nm.

When the probe light beam 28 passes through the polarized alkali metal vapor 14 in the vapor cell 12, the plane of polarization of the probe light beam 28 is rotated through an angle that depends on the magnetic field, which, absent applied fields, is the ambient magnetic field B. After an optical filter 36 separates the probe light beam 28 from the pump light beam 18, the atomic magnetometer 10 senses the ambient magnetic field B by detecting the amount of optical rotation of the probe light beam 28.

In an example, the optical filter 36 for separating the probe light beam 28 from the pump light beam 18 is constituted by an optical interference filter, which has a passband centered on the wavelength of the probe light beam 28. It should be noted, however, that with a pulsed pump light beam 18, the optical filter 36 might not be strictly necessary.

A polarization beamsplitter 38 is oriented at an angle of 45° to the plane of polarization of the probe light beam 28 at zero field. At zero field, polarization beamsplitter 38 splits the probe light beam 28 into two substantially equal beams 28' that impinge a pair of photodetectors 40 for balanced detection of the probe light beam 28.

In examples, photodetectors 40 are silicon photodetectors or III-V compound semiconductor photodetectors. Each photodetector 40 generates a corresponding electrical signal 42 which is proportional to an amount of the probe light beam 28' incident on it. The electrical signals 42 are provided as inputs to a transimpedance amplifier 44, which differentially amplifies the input electrical signals 42 to provide an output voltage signal 46. Rotation of the probe light beam 28 will cause the respective beams 28' reaching the photodetectors 40 to differ in intensity. This difference will affect the output voltage signal 46, thereby providing an indication of the sign of the rotation and the magnitude of the ambient magnetic field B sensed by the atomic magnetometer 10. In the example shown, output voltage 46 goes to lock-in amplifier 50 for synchronous detection.

Residual magnetic fields due, e.g., to the earth's magnetic field or to nearby electrically powered equipment or even to nearby ac electrical wiring, can interfere with the operation of the atomic magnetometer 10 and can reduce its sensitivity. One or more sets of coils 48, placed about the vapor cell 12, can be used to partially or wholly cancel these residual fields when energized with suitable electric currents. Residual fields can also be reduced by magnetically shielding the magnetometer with, for example, one or more layers of a high-permeability material such as mu metal together with one or more layers of an electrically conducting material such as aluminum.

Figure 2:
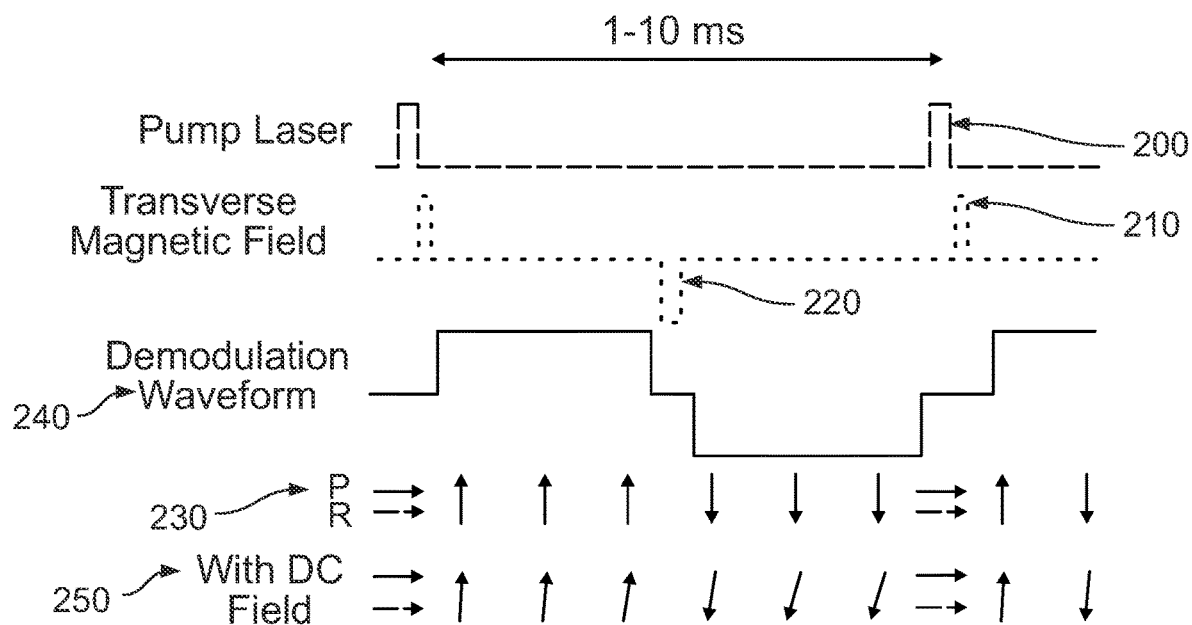
FIG. 2 is a simplified timing diagram, presented as a pedagogical aid to an understanding of a mode of operating an atomic magnetometer with collinear pump and probe light beams in accordance with at least one embodiment of the present invention.

FIG. 2 is a simplified timing diagram, presented as a pedagogical aid to an understanding of our new mode of operating an atomic magnetometer. FIG. 2 illustrates the timing of pulses from the pump laser that propagate along the z-axis, and it illustrates the timing of applied magnetic pulses that are transverse; i.e., they are directed along an axis orthogonal to the z-axis. The probe light beam, not indicated in FIG. 2, is on continuously and collinear with the optical pump pulses.

A measurement cycle is the interval between pulses 200 of the pump laser. As indicated in FIG. 2, this interval is typically 1-10 ms long, though in other embodiments the measurement cycle may be shorter or longer than 1-10 ms. Within the measurement cycle, there are applied magnetic pulses of two kinds. An applied magnetic π/2 pulse 210 applied just after optical pump pulse 200 initiates the measurement cycle. In addition to the applied magnetic π/2 pulse 210, an applied magnetic π pulse 220 in each cycle inverts the polarization vector from its previous direction. The applied magnetic π/2 pulse 210 and the applied magnetic π pulse 220, along with period(s) of no applied magnetic field, form an overall applied magnetic waveform. As will be described below with reference to FIGS. 11A-11E, the applied magnetic waveform may have any number of desired applied magnetic π/2 pulses and applied magnetic π pulses, along with any number of desired period(s) of no applied magnetic field. As will also be described below with reference to FIGS. 11A-11E, the applied magnetic waveform may have components in one or more of the x-, y-, and z-directions.

In the lower part of FIG. 2, beneath the timing waveforms, there are two rows of arrows. In each row, arrows respectively represent the polarization vector P of the atomic vapor, and the pumping rate R, which is zero at all times except during the pulses of the pump laser. The upper row 230 represents the condition of no ambient magnetic field. The lower row 250 represents the condition when a static ambient magnetic field having a component in the x- or y-direction is present. As will be appreciated, when the applied magnetic π/2 pulse 210 is applied in the x- or y-direction, the measured result will likewise be the x- or y-direction component of the ambient magnetic field, respectively. It should be borne in mind that only an idealized situation is illustrated. Real situations, as well as realistic simulations, exhibit non-idealities such as a decay of the polarization vector P over time.

Turning to row 230 in FIG. 2, it will be seen that the optical pump pulse produces an initial polarization that, in the illustrated example, points in the positive or negative z-direction. The applied magnetic π/2 pulse rotates the polarization to a new direction that, in the illustrated example, points vertically upward. The applied magnetic π pulse, as noted, inverts the polarization vector from its previous direction. A new measurement cycle then begins with the next optical pump pulse. It should be noted in this regard that the number of applied magnetic π pulses is arbitrary, and that the case described here of a single applied magnetic π pulse is merely illustrative.

The purpose of the applied magnetic π pulses is to facilitate lock-in detection, which, if used, can suppress noise from, e.g., the probe laser. Lock-in detection can also reject some of the undesirable effects of cross-axis fields. The applied magnetic π pulses can be omitted if lock-in detection is not used. Lock-in detection, as the term is used here, involves a bipolar demodulation waveform, i.e., the demodulation waveform alternates between positive and negative values. It should be noted in this regard that synchronous detection can be used even if the applied magnetic 7C pulses are omitted, although at least some demodulation waveforms that may be useful in such instances are positive-going waveforms without sign reversal.

A demodulation waveform 240 is also shown in FIG. 2. The demodulation waveform is applied to the detector output signal, in, e.g., the digital domain, as part of the process of lock-in detection and demodulation by a numerical processor. In this case, the optical probe beam is applied continuously during the measurement cycle. In other embodiments of the present invention, for example, those described below with reference to FIGS. 11A-11E, the demodulation waveform will have a value of zero except when the optical probe beam is turned on, i.e., the optical probe pulse is applied.

Turning to row 250 in FIG. 2, it will be seen that the polarization behavior is similar, but now a polarization component directed alternatingly in the positive or negative x- or y-direction is seen to gradually accrue. Recalling that τ=μ×B, it will be understood that an ambient magnetic field perpendicular to the plane of FIG. 2 and directed away from the viewer will exert a torque that tends to rotate an upwardly directed polarization vector P toward the right; that is, to add a polarization component in the positive z-direction.

This effect accrues over the duration of the measurement cycle. Because the torque maintains its direction, the angle of rotation continues to grow, even though the direction of the atomic polarization is periodically reversed by an applied magnetic π pulse.

With further reference to row 250 of FIG. 2, it will be seen that the polarization vector P is initialized again at the beginning of the next measurement cycle.

Figure 3:
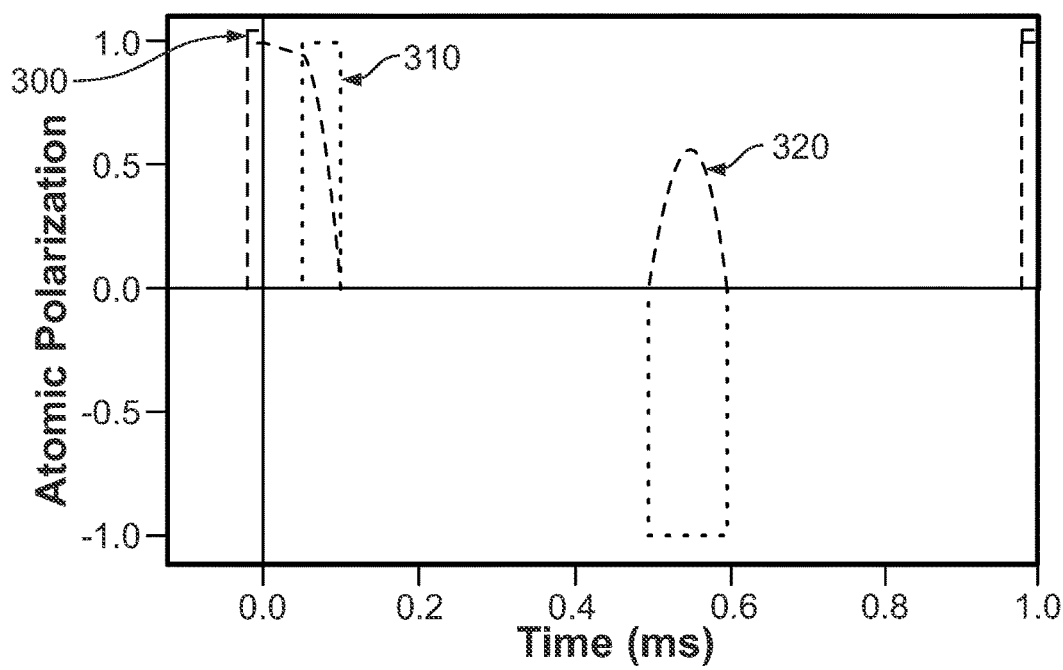
FIGS. 3 and 4 are timing diagrams for a simulated measurement cycle performed on a rubidium vapor cell under zero ambient magnetic field (FIG. 3) and under a static ambient magnetic field of 10 nT directed in the positive y-direction (FIG. 4) of an atomic magnetometer with collinear pump and probe light beams in accordance with at least one embodiment of the present invention.

FIG. 3 is a plot for a simulated measurement cycle performed on a rubidium vapor cell under zero ambient magnetic field. The units on the horizontal scale are milliseconds, and on the vertical scale, which is linear, "1.0" denotes 100% polarization. Trace 300 represents the pumping rate, the leading edge of which is partially obscured by the leading edge of trace 320 just prior to Time=0.0 ms. Note that Time=0.0 ms corresponds to the start of the measurement cycle in FIG. 3 as this is the point when the optical pump pulse is turned off. One may alternatively term the start of the measurement cycle as the time when the optical pump pulse is turned on, i.e., at Time=~–0.02 ms. Trace 310 represents the applied magnetic field (normalized), and trace 320 represents the z-component $P_z$ of the polarization vector P. Trace 320 obscures the start of trace 300 as a strong optical pump pulse was employed, rapidly building up $P_z$. A weaker optical pump pulse would result in a slower build-up of $P_z$. Illustratively, the applied magnetic field is directed in the positive direction along the y-axis. For the purpose of discussing FIG. 3 and FIG. 4 which follows it, $P_z$ will also be referred to as the signal.

As shown in FIG. 2, each optical pump pulse reinitializes the polarization vector, the applied magnetic field π/2 pulse rotates the polarization vector to the x-axis, and the applied magnetic π pulse rotates the polarization vector until it has reversed direction.

As those skilled in the art will recognize, the polarization will decrease over the course of each cycle because of decay mechanisms. It should also be noted that the simulations shown in FIGS. 3 and 4 neglect the polarization and magnetic field dependence of the effective gyromagnetic ratio and decoherence rate, which is characteristic of transitioning out of and back into the spin-exchange relaxation-free (SERF) regime as the large magnetic field pulses are applied. The SERF regime will be described in more detail below.

Figure 4:
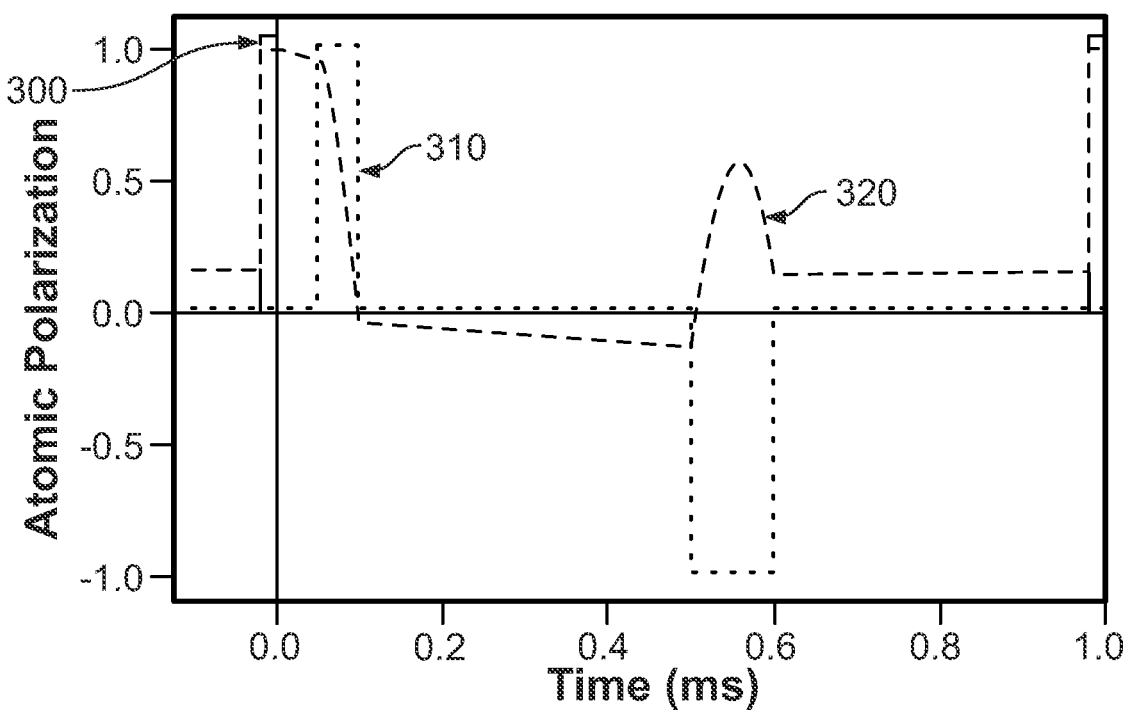

FIG. 4 is similar to FIG. 3, but now, there is a static ambient magnetic field of 10 nT directed in the positive y-direction.

For the same reasons explained above in reference to FIG. 2, the signal trace 320 is seen in FIG. 4 to accumulate over time during the measurement cycle. The signal trace 320 is seen to reverse in sign after the applied magnetic π pulse.

Figure 5A:
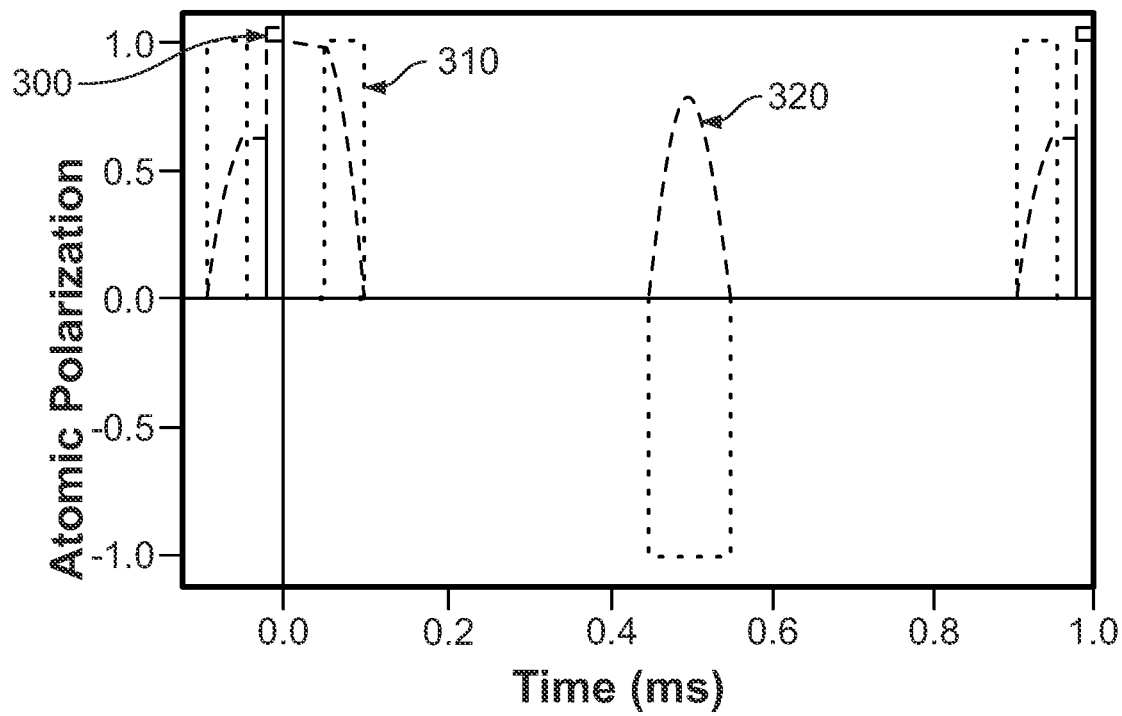
FIGS. 5A and 5B illustrate a simulated measurement cycle similar to that illustrated in FIGS. 3 and 4, respectively, but with the addition of an applied magnetic field $\pi/2$ pulse shortly before the optical pump pulse of the next measurement cycle
Figure 5B:
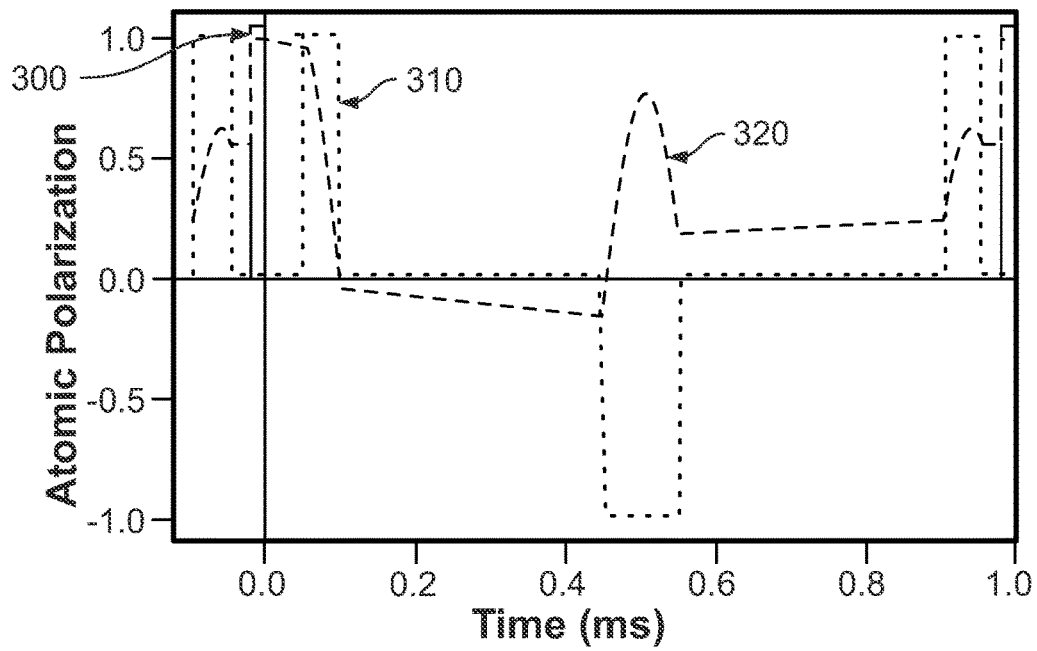

FIGS. 5A and 5B illustrate a simulated measurement cycle similar to that illustrated in FIGS. 3 and 4, respectively, but with the addition of an applied magnetic field π/2 pulse shortly before the optical pump pulse of the next measurement cycle. As illustrated in FIGS. 5A and 5B, this second applied magnetic field π/2 pulse is used to align residual atomic polarization with the z-axis prior to the subsequent optical pump pulse. This is especially beneficial if the pump laser used to generate the optical pump pulse is underpowered.

Figure 6:
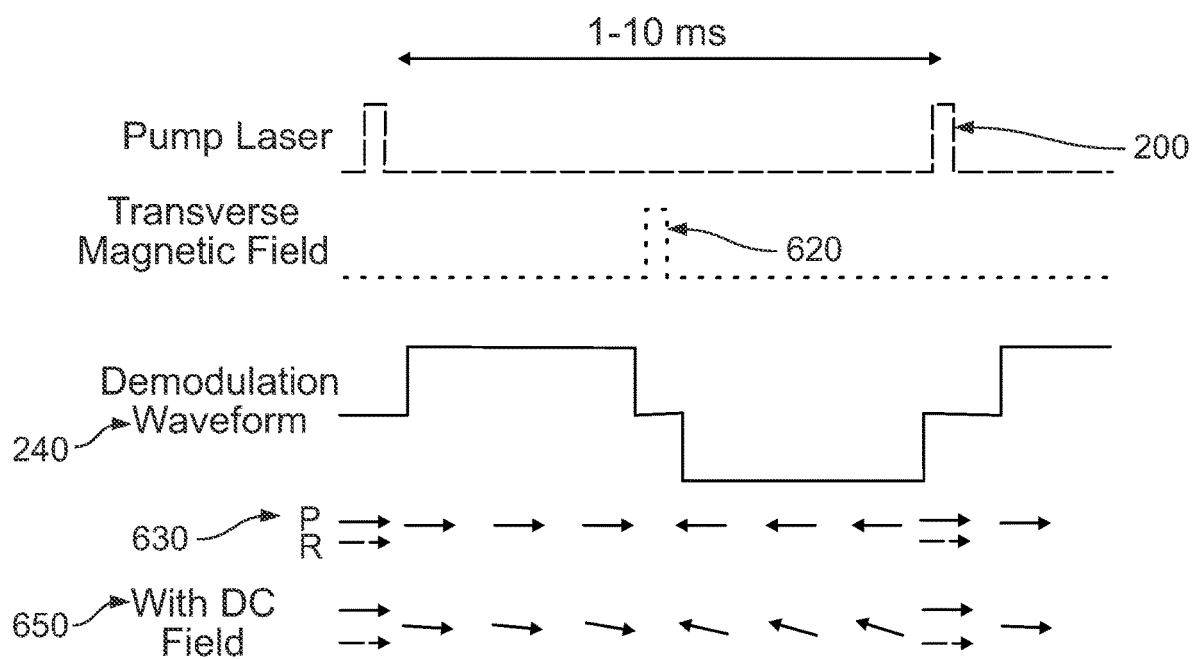
FIG. 6 is a simplified timing diagram, presented as a pedagogical aid to an understanding of our new mode of operating an atomic magnetometer with orthogonal pump and probe light beams in accordance with at least one embodiment of the present invention.

FIG. 6 is a simplified timing diagram, similar to FIG. 2, but instead of employing collinear pump and probe light beams, orthogonal pump and probe light beams are employed. A comparison of FIGS. 2 and 6 shows that the use of orthogonal pump and probe light beams obviates the need for the applied magnetic π/2 pulse 210. Both measurement cycles employ the applied magnetic π pulse 220 to facilitate the use of lock-in demodulation, though with opposite polarities. The upper row 630 and lower row 650 of arrows represent the polarization vector P of the atomic vapor and the pumping rate R, which is zero at all times except during the pulses of the pump laser. Unlike FIG. 2, the arrows representing the polarization vector P remain horizontal in row 630 as there is no applied magnetic π/2 pulse 210. The direction of the arrows representing the polarization vector P do rotate by 180° due to the applied magnetic π pulse 620. The lower row 650 represents the condition when a static ambient magnetic field having a component in the x- or y-direction is present. This static ambient magnetic field causes the arrows representing the polarization vector P to precess over time, and, after application of the applied magnetic π pulse 620, the direction of the arrows representing the polarization vector P rotate by 180° and then continue their precession.

Figure 7:
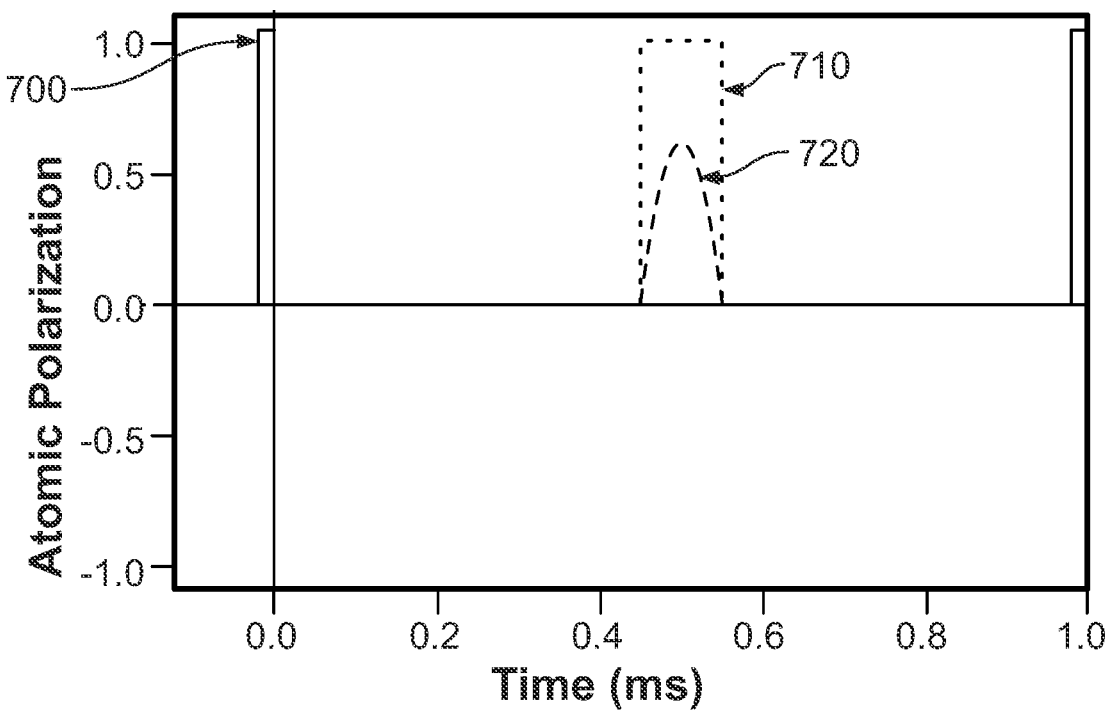
FIGS. 7 and 8 are timing diagrams for a simulated measurement cycle performed on a rubidium vapor cell under zero ambient magnetic field (FIG. 7) and under a static ambient magnetic field of 10 nT directed in the positive y-direction (FIG. 8) of an atomic magnetometer with orthogonal pump and probe light beams in accordance with at least one embodiment of the present invention.
Figure 8:
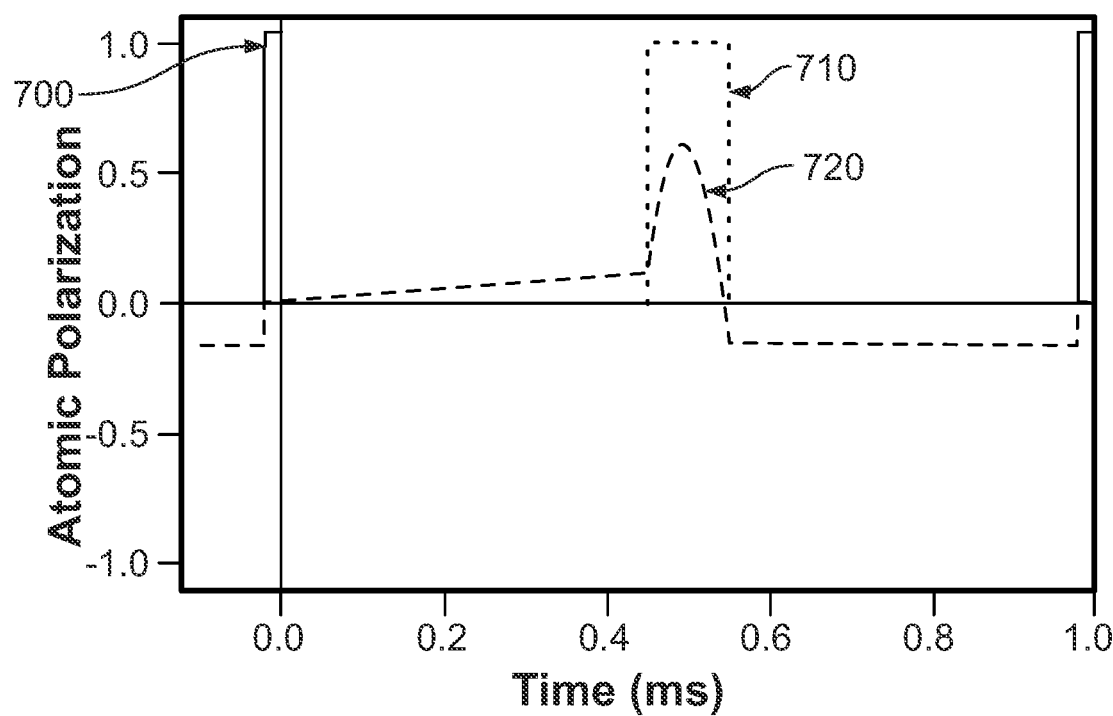

FIGS. 7 and 8 correspond to FIGS. 3 and 4, but with orthogonal pump and probe light beams. Illustratively, the probe light beam propagates along the x-direction and thus measures $P_x$ of the polarization vector P. The pumping rate, the applied magnetic field, and the x-component $P_x$ of the polarization vector P are illustrated as traces 700, 710, and 720, respectively. As with FIGS. 3 and 4, FIGS. 7 and 8 correspond to the cases of no static ambient magnetic field and a static ambient magnetic field of 10 nT directed in the positive y-direction, respectively.

As noted above, the applied magnetic field can be modulated as a sinusoid instead of a bipolar train of rectangular pulses as in FIGS. 3, 4, 7, and 8. We performed a simulation to show how the signal responds with sinusoidal modulation. The result at zero ambient magnetic field and y-directed sinusoidal field modulation is shown in FIG. 9, and the result at a y-directed ambient magnetic field of 1 nT is shown in FIG. 10.

Figure 9:
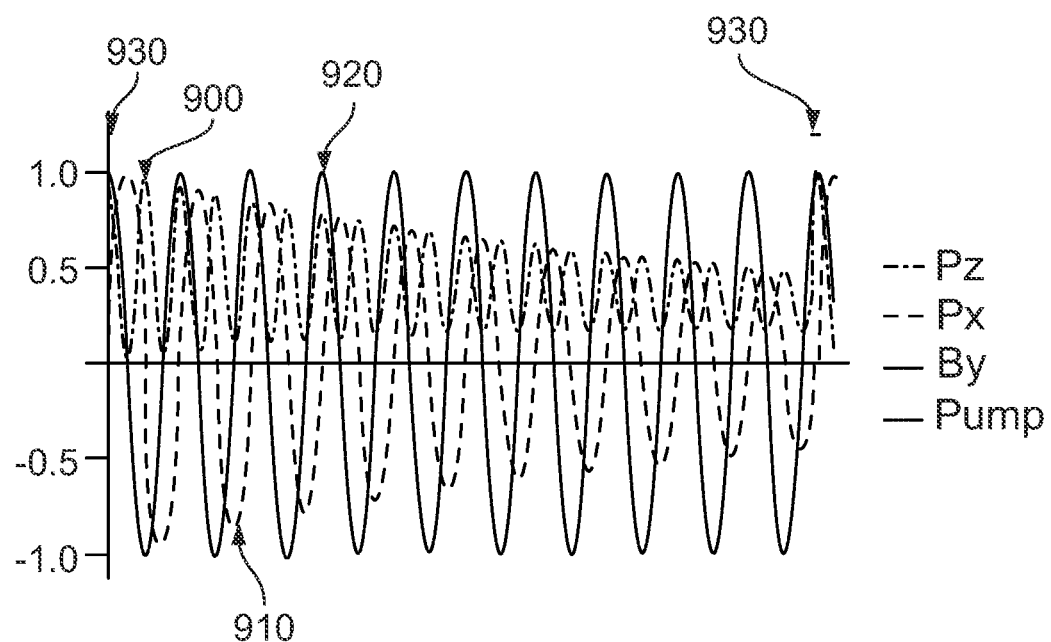
FIGS. 9 and 10 are graphs of the response of a magnetometer of the kind described here under sinusoidal modulation in zero ambient magnetic field (FIG. 9) and in a y-directed ambient magnetic field of 1 nT (FIG. 10).
Figure 10:
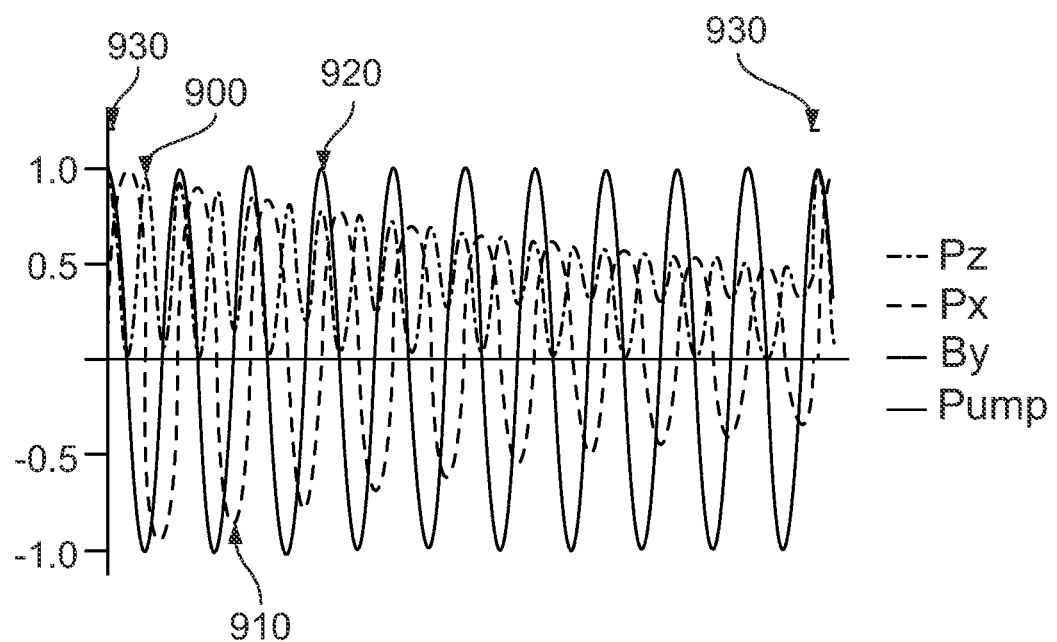

The vertical scale in FIGS. 9 and 10 represents fractional polarization. The units on the horizontal scale are seconds. The traces shown in FIGS. 9 and 10 are for the z-component $P_z$ of the polarization vector (trace 900), the x-component $P_x$ of the polarization vector (trace 910), the normalized value By of the applied sinusoidal magnetic field (trace 920), and the pumping rate R (trace 930).

A noteworthy feature of FIG. 10 is the emergence of the first harmonic in the z-component $P_z$ of the polarization vector (trace 900). This arises as the atomic polarization vector precesses under the influence of the applied sinusoidal magnetic field and oscillates symmetrically about the z-axis. When a quasistatic ambient magnetic field is parallel with the applied sinusoidal magnetic field, the first harmonic component in the signal trace 900 arises, and the amplitude and phase of the first harmonic are measured to determine the ambient magnetic field strength and direction (positive or negative projection along the sensitive axis).

FIGS. 9 and 10 show ten cycles of applied magnetic field modulation per measurement period. It should be understood that this is only an illustrative example and not meant to be limiting. The sinusoidal modulation of the applied magnetic field provides the signal conditioning needed for lock-in detection and subsequent demodulation, for example, by a numerical processor. In one sense, the sinusoidal modulation of the applied magnetic field takes the place of the applied magnetic π pulses that were used in the previous examples discussed above with reference to FIGS. 3 and 4. In a second sense, the sinusoidal modulation of the applied magnetic field takes the place of the applied magnetic π/2 pulses that were also used in those examples.

If the modulation frequency of the applied magnetic field is not too large, maximum sensitivity is achieved when the sinusoidal modulation drives, at peak, close to 90° of rotation of the polarization from the z-axis.

As explained above, the signal accessible to the probe light beam is embodied only in the z-component of the polarization vector, i.e., $P_z$. Despite this limitation, however, the magnetometer can be used to make vector measurements of an arbitrarily oriented ambient magnetic field. This is achieved using a three-axis field coil, i.e., a set of coils that can produce an applied magnetic field of any desired orientation.

To make measurements of all three vector components of an ambient magnetic field, the applied magnetic field is used in two ways. One is to rotate the polarization vector onto a desired axis so that precession in the ambient magnetic field can advance on the other two axes, producing a change in the polarization that we refer to as accumulated phase. The other is to rotate the polarization vector P with the applied magnetic field pulses to project different components of the polarization vector P along the z-axis so that it can be sensed by the probe light beam as would be the case with collinear pump and probe light beams.

Using a combination of the two approaches, all three components of the ambient magnetic field can be computed from the output of a suitably designed manipulative sequence that we refer to as a 3D measurement cycle. Each such 3D measurement cycle begins with an optical pump pulse. After pumping, applied magnetic π/2 pulses for exchanging polarization axes are alternated with free precession intervals for accumulating phase. The z-component of the polarization vector $P_z$ is probed at least three times during each 3D measurement cycle.

Care must be taken in devising the 3D measurement cycle. If the ambient magnetic field is small enough, a first-order approximation will be sufficient for interpreting the ambient magnetic field information impressed on the various polarization axes. However, to be able to derive complete ambient magnetic field information from the polarization measurements, information about the respective ambient magnetic field components should be impressed on the respective polarization axes in such a way that the contributions of the different ambient magnetic field components are separable. An example measurement cycle suitable for that purpose is described below.

We will now present an analytical expression for the spin precession in an initially fully polarized system, together with an approximation to second order. Symbols that we introduce here will be used again, below, when we describe an example of a 3D measurement cycle.

The symbol $\gamma(P)$ represents the gyromagnetic ratio of the alkali atom. The gyromagnetic ratio is represented as a function of the polarization vector P because we assume here that the magnetometer is being operated in the SERF regime. The SERF regime is characterized by conditions of high atomic density and low magnetic field, under which spin exchange between atoms is fast relative to the frequency of magnetic precession of the atoms, so that the average spin interacts with the field and is not destroyed by spin exchange collisions. For a population of atoms having a complex ground-state hyperfine manifold, the collisional spin exchange in the SERF regime produces a collective gyromagnetic ratio that is a function of the polarization vector.

The duration of one free precession interval is denoted t.

We define phase T per unit field strength by $T=\gamma(P) \cdot t$.

The total ambient magnetic field applied to the system is here denoted B. Accordingly, an angular scale factor $\theta_s$ for the precession accumulated over one free precession interval is defined by $\theta_s=|B| \cdot \gamma(P) \cdot t$.

Let the initial polarization vector P start be directed along the z-axis, that is, $$\vec{P}_{start} = \begin{pmatrix} 0 \\ 0 \\ 1 \end{pmatrix}.$$

This would be the starting state for the orthogonal pump-probe case illustrated in FIG. 6. In the collinear pump-probe case illustrated in FIG. 2, the initial applied magnetic $\pi/2$ pulse immediately rotates the starting polarization to the x or y-direction. Then the rotated polarization vector $\vec{P}_{end}$ at the end of the free precession interval is given by:

$$\vec{P}_{end} = \begin{pmatrix} b_x b_z(1-\cos[\theta_s]) + b_y\sin[\theta_s] \\ b_y b_z(1-\cos[\theta_s]) - b_x\sin[\theta_s] \\ b_z b_z(1-\cos[\theta_s]) + \cos[\theta_s] \end{pmatrix} \approx \begin{pmatrix} B_y T + \frac{1}{2} B_x B_z T^2 \\ -B_x T + \frac{1}{2} B_y B_z T^2 \\ 1 - \frac{B_x^2 T^2}{2} - \frac{B_y^2 T^2}{2} \end{pmatrix},$$ (I)

where the last portion of the above expression is an approximation to second order in phase.

A decaying exponential factor, to account for polarization decay, has been omitted in order to simplify the above expressions. It should be understood as implicit.

The quantities $B_x$, $B_y$, and $B_z$ are the respective x-, y-, and z-components of the ambient magnetic field B, and the quantities $b_x$, $b_y$, and $b_z$ are the equivalent quantities normalized to the magnitude of the ambient magnetic field B, i.e., $b_x=B_x/|B|$, etc.

It is clear from (I) that two components of the measured ambient magnetic field, i.e., $B_x$ and $B_y$, show a linear dependence in two components of the atomic polarization, i.e., $P_y$ and $P_x$, respectively. These two components of the atomic polarization can be read out (and thereby the strength of the corresponding component of the ambient magnetic field) by applying the appropriate magnetic pulses to rotate a particular component of the ambient magnetic field to be parallel to the probe axis. The effects of the various applied magnetic $\pi$ pulses and applied magnetic $\pi/2$ pulses on the polarization vector P are readily calculated by applying the corresponding rotation matrices to the above expressions.

For example, a y-directed applied magnetic $\pi$ pulse halfway through the measurement period with measurement times of T/2 on either side of the applied magnetic $\pi$ pulse produces a rotated polarization vector $\vec{P}_{end,rot}$ given approximately by:

$$\vec{P}_{end,rot} \approx \begin{pmatrix} -B_y T \\ -\frac{1}{4} B_y B_z T^2 \\ -1 + \frac{B_y^2 T^2}{2} \end{pmatrix}.$$ (II)

The above expression has the favorable property that the x-component has no second-order response. This provides additional motivation to add an applied magnetic $\pi$ pulse to the measurement cycle.

As pointed out above, care must be taken in devising a practical 3D measurement cycle because of the complications associated with higher-order effects. We have, in fact, devised various 3D measurement cycles that can give measurements that are accurate enough to be useful for many potential applications, where each of the 3D measurement cycles may have differing advantages with respect to implementation and noise suppression. A timing diagram for a simulated 3D measurement cycle is provided in FIG. 11A, to which attention is now directed. In each of FIGS. 11A-11E, the pump and probe light beams are collinear along the z-axis. It should be understood, however, that the 3D measurement cycle of FIG. 11A is meant only as an illustrative example, and not as limiting the scope of the present invention.

Figure 11A:
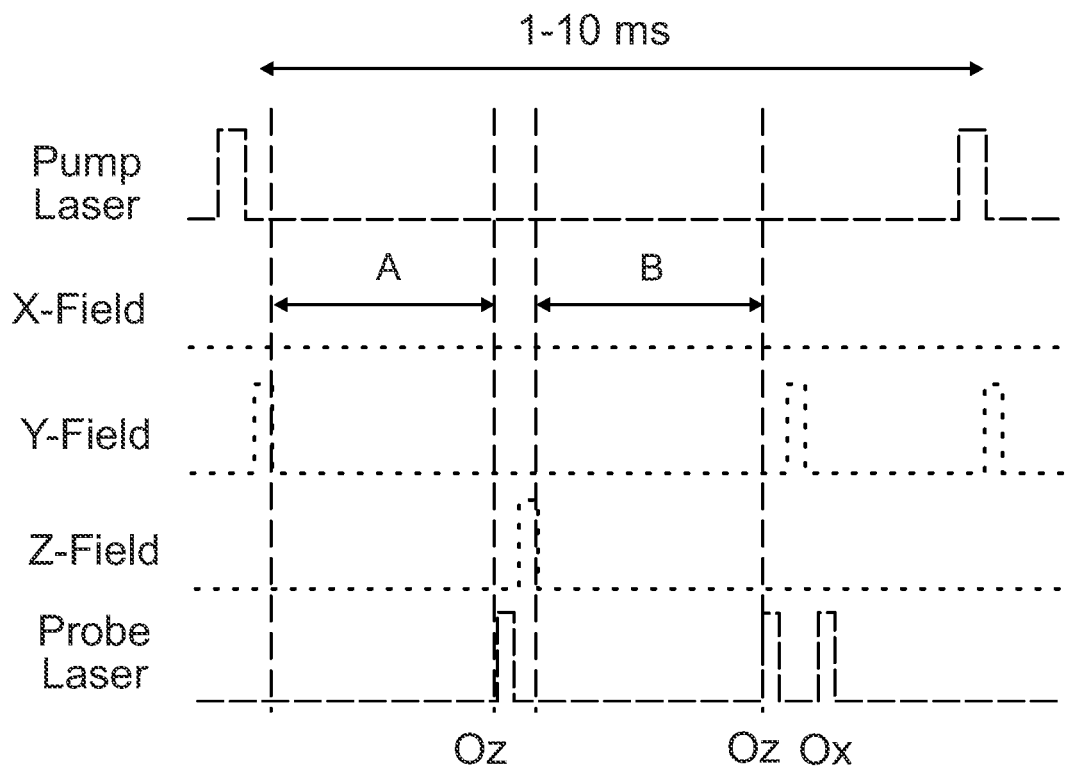
FIG. 11A is a timing diagram for a simulated 3D measurement cycle in accordance with at least one embodiment of the present invention.

FIG. 11A indicates that there is an interval of 1-10 ms between optical pump pulses. FIG. 11A should be understood as merely a non-limiting example. The total time interval t for free precession is divided into nominally equal half-intervals A and B.

As indicated in FIG. 11A, the optical pump pulse is followed immediately by an applied magnetic $\pi/2$ pulse along the y-axis, which rotates the polarization vector P onto the x-axis. In that condition, phase accumulates on the y- and z-axes for the duration t/2 of half-interval A. The system is probed at the end of half-interval A with the first optical probe pulse labeled "Oz" in FIG. 11A. This optical probe pulse Oz yields a measurement $P_{half,z}$ equal to the phase accumulated on the z-axis during half-interval A.

Immediately after the first optical probe pulse Oz, a magnetic $\pi/2$ pulse is applied along the z-axis, which rotates the polarization vector P substantially onto the y-axis. In that condition, phase accumulates on the x- and z-axes for the duration t/2 of half-interval B. The system is probed at the end of half-interval B with the second optical probe pulse labeled "Oz" in FIG. 11A. This second optical probe pulse Oz yields a measurement $P_{end,z}$ equal to the phase accumulated on the z-axis during the full free precession interval.

Immediately after the second optical probe pulse Oz, a magnetic $\pi/2$ pulse is applied along the y-axis, which interchanges the x- and z- components of the polarization vector. Immediately afterward, the system is probed with the optical probe pulse labeled "Ox" in FIG. 11A. This optical probe pulse Ox yields a measurement $P_{end,x}$ of the phase accumulated on the x-axis during half-interval B.

The value $P_{half}$ of the polarization vector at the end of half-interval A and the value $P_{end}$ of the polarization vector at the end of half-interval B can be derived from the relations given above, with application of the pertinent rotation matrices. These values, to second order, are given below:

$$\vec{P}_{half} = \begin{pmatrix} 1 - \dfrac{B_y^2 T^2}{8} - \dfrac{B_z^2 T^2}{8} \\ \dfrac{B_z T}{2} + \dfrac{1}{8} B_x B_y T^2 \\ -\dfrac{B_y T}{2} + \dfrac{1}{8} B_x B_z T^2 \end{pmatrix} \text{ and} \quad \text{(III)}$$

$$\vec{P}_{end} = \begin{pmatrix} -B_z T - \dfrac{B_y^2 T^2}{4} \\ 1 - \dfrac{B_x^2 T^2}{8} + \dfrac{1}{4} B_x B_y T^2 - \dfrac{B_y^2 T^2}{8} - \dfrac{B_z^2 T^2}{2} \\ \dfrac{B_x T}{2} - \dfrac{B_y T}{2} + \dfrac{1}{8} B_x B_z T^2 + \dfrac{3}{8} B_y B_z T^2 \end{pmatrix}.$$

The components $B_x$, $B_y$, $B_z$ of the ambient magnetic field B can be obtained, in a first-order approximation, from the above expressions, according to:

$P_{end,x} = -B_z T$ $P_{end,z} - P_{half,z} = B_x T/2$, and $P_{half,z} = -B_y T/2$. \quad (IV)

It will be evident from the above expressions that an accuracy better than 99% is predicted for total precessions of 10% or less.

As those skilled in the art will recognize, obtaining the value $P_{half}$ already suffices to provide a measure of $B_y$ and $B_z$ via a magnetic π/2 pulse being applied along the x-axis, which interchanges the y- and z- components of the polarization vector. In fact, each of the measurement cycle schemes presented in FIGS. 11A-11E can be modified to measure only two components of the ambient magnetic field. If only two axes of the ambient magnetic field are measured per measurement cycle, a three axis measurement could still be performed b, interleaving measurement cycles that measure different ambient magnetic field components. For example, a first cycle could apply an initial π/2 pulse along the y-axis to provide a measure of the y- and z- components of the ambient magnetic field, and a second cycle could apply an initial π/2 pulse along the x-axis to provide a measure of the x- and z- components of the ambient magnetic field.

The measurement cycle described above can be adapted for lock-in detection $b_y$ using a rapid sequence of applied magnetic π pulses and optical probe pulses. This would be helpful for reducing noise due to the optical probe pulses, among other things.

Figure 11B:
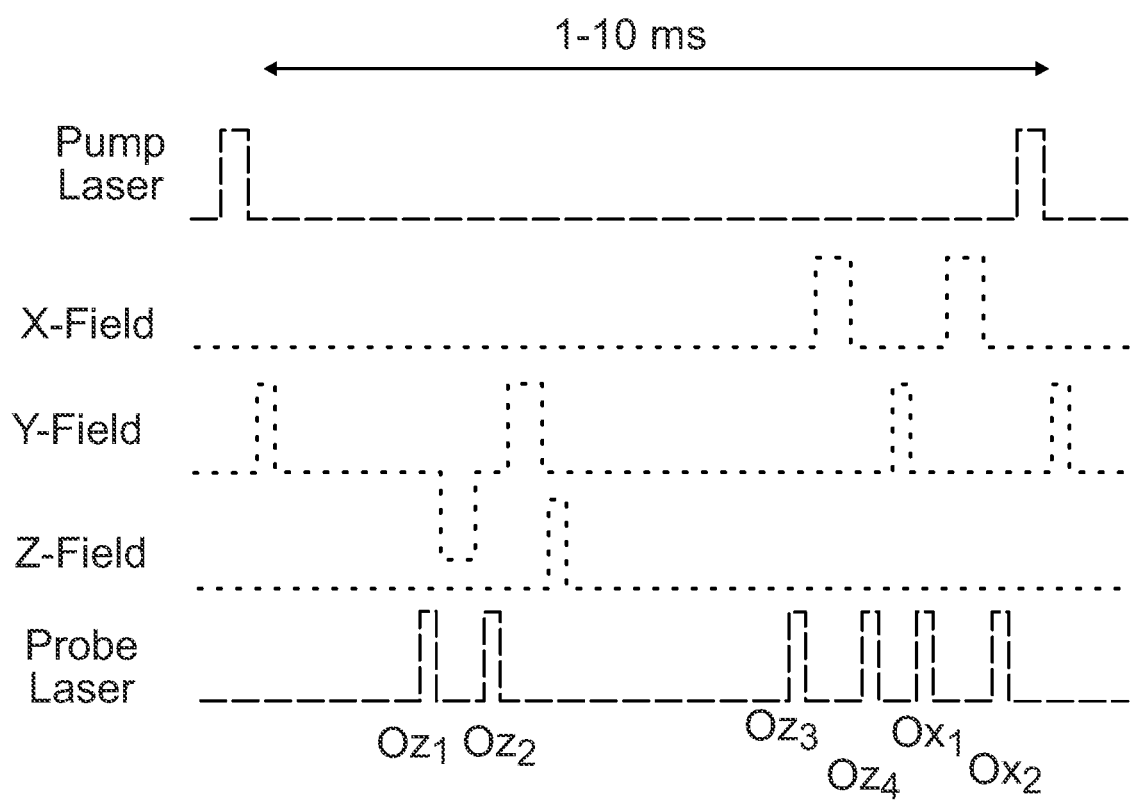
FIGS. 11B-11E are timing diagrams for simulated measurement cycles in accordance with at least one embodiment of the present invention, in which various applied magnetic π/2 and π pulses are added to the measurement sequence of FIG. 11A.

FIG. 11B is a timing diagram for an illustrative example in which applied magnetic 7C pulses are added to the measurement sequence of FIG. 11A. The timing diagram illustrated in FIG. 11B requires applied magnetic pulses along all three axes. Turning to FIG. 11B, it will be seen that the first optical probe pulse Oz is now replaced by a pair of optical probe pulses $O_{z1}$, $O_{z2}$, which straddle an applied magnetic π pulse that is directed on the negative y-axis and that is followed by an applied magnetic π pulse directed on the positive y-axis. Likewise, the second optical probe pulse Oz is now replaced by a pair of optical probe pulses $O_{z3}$, $O_{z4}$, which straddle an applied magnetic π pulse that is directed on the positive x-axis and that is paired with a subsequent applied magnetic π pulse also directed on the positive x-axis. Similarly, the subsequent applied magnetic 7C pulse is straddled by a pair of optical probe pulses $O_{x1}$, $O_{x2}$ that replace the optical probe pulse Ox of FIG. 11A. A suitable demodulation scheme for use with this sequence will be readily apparent to those skilled in the art.

Figure 11C:
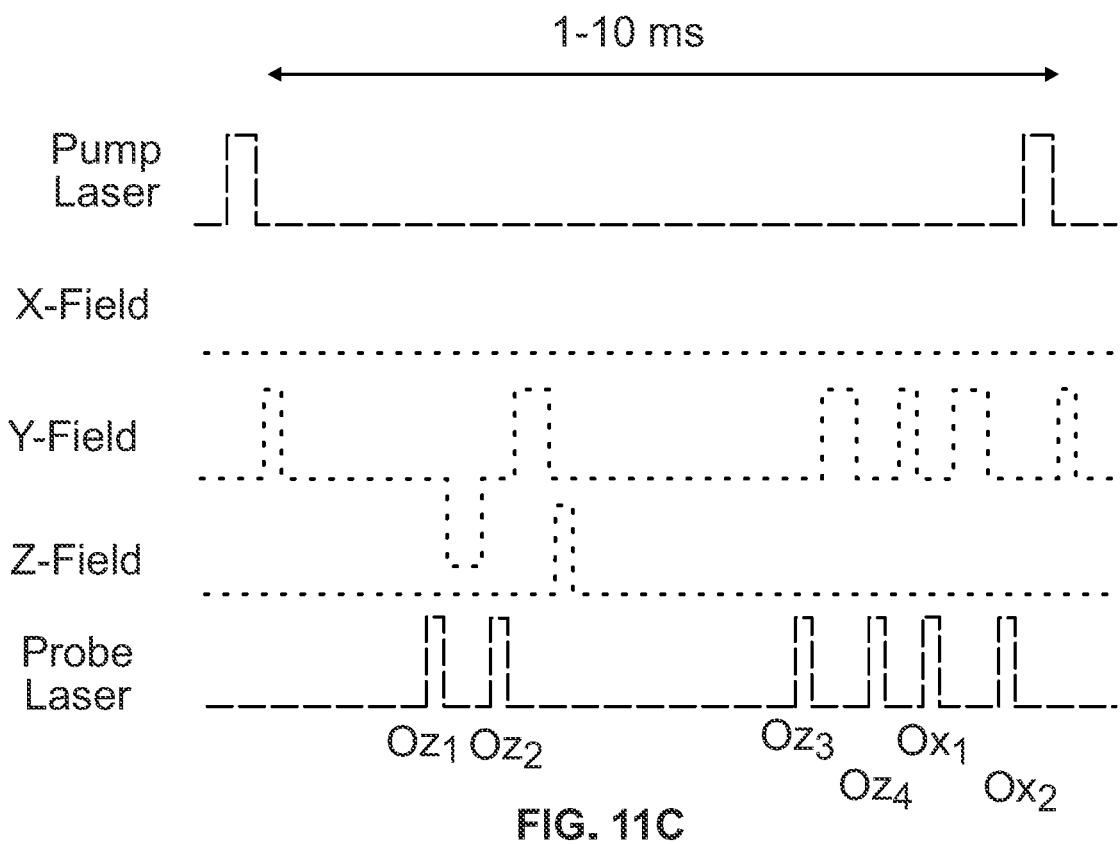

FIG. 11C is a timing diagram for an illustrative example in which alternative applied magnetic π pulses are employed relative to the measurement sequence of FIG. 11B. The timing diagram illustrated in FIG. 11C, similar to the timing diagram illustrated in FIG. 11A, does not require any applied magnetic pulse on the x-axis. The timing diagram of FIG. 11C includes a first pair of optical probe pulses $O_{z1}$, $O_{z2}$, which straddle a first applied magnetic π pulse directed on the negative y-axis. A second pair of optical probe pulses $O_{z3}$, $O_{z4}$ straddle a third applied magnetic 7C pulse, with this pulse directed on the positive y-axis. A pair of optical probe pulses $O_{x1}$, $O_{x2}$ again straddle an applied magnetic π pulse, though in this instance it is directed on the positive y-axis, not the positive x-axis employed with the timing diagram of FIG. 11B.

Figure 11D:
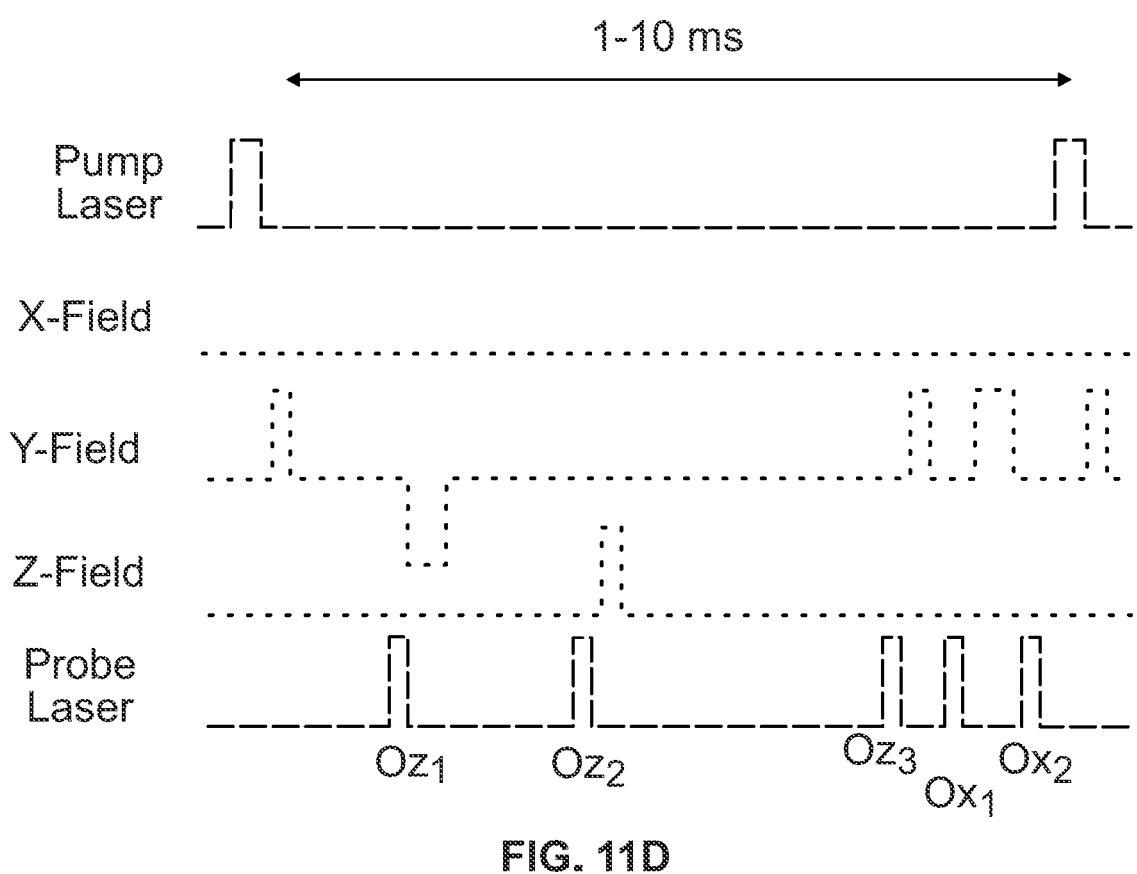

FIG. 11D is a timing diagram for an illustrative example in which alternative applied magnetic π/2 and π pulses are employed relative to the measurement sequences of FIGS. 11B and 11C. In the first half of the timing diagram illustrated in FIG. 11D, the applied magnetic field pulse sequence is similar to that of FIG. 2 where there is a π pulse in the middle of the first the precession period, but here optical probe pulses are used. In the second half of the sequence, precession proceeds in a fashion similar to FIGS. 11B and 11C, with an optical probe pulse sequence at the end. The difference between $O_{z1}$ and $O_{z2}$ provides information about the y-component of the ambient magnetic field B, i.e., $B_y$, while the difference between $O_{z2}$ and $O_{z3}$ provides information about the x-component of the ambient magnetic field B, i.e., $B_x$. A pair of optical probe pulses $O_{x1}$, $O_{x2}$ again straddle an applied magnetic π pulse directed on the positive y-axis, providing information about the z-component of the ambient magnetic field B, i.e., $B_z$.

Figure 11E:
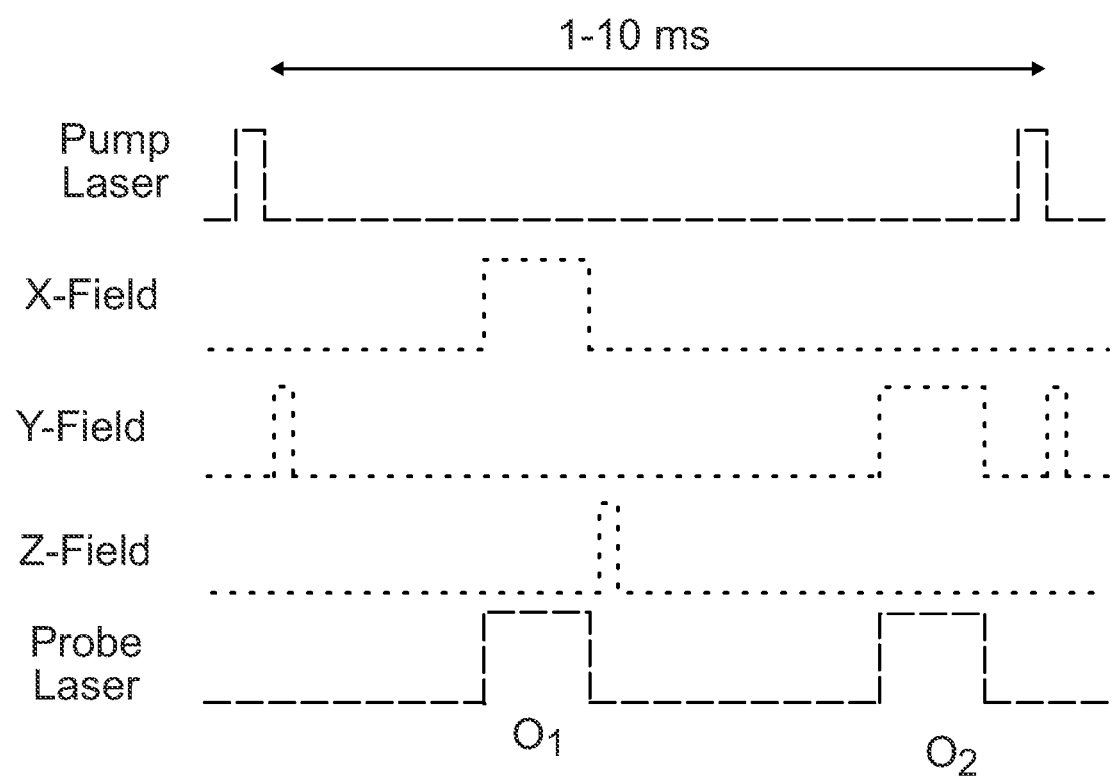

FIG. 11E is a timing diagram for an illustrative example in which a magnetic field pulse and an optical probe pulse are simultaneously applied. In contrast to FIGS. 11A-D where components of the spin polarization are measured at discrete intervals between applied magnetic π/2 or π pulses, an extended optical probe pulse measures the components of the spin polarization as they precess around the strong applied magnetic field. The optical probe pulse is demodulated by multiplying $b_y$ an appropriately phased sine wave. For example, in FIG. 11E after a free precession period, a magnetic field pulse is applied along the x-axis during application of an optical probe pulse $O_1$, and demodulating the resultant probe signal by $\cos(B_{P,1} \gamma t)$ yields information about $P_z$ and thereby the y-component of the ambient magnetic field B, i.e., $B_y$. Similarly, by demodulating the resultant probe signal by $\sin(B_{P,1} \gamma t)$ yields information about $P_y$ and thereby the z-component of the magnetic field B, i.e., $B_z$. Here, $B_{P,1}$ is the ambient magnetic field strength during the optical probe pulse $O_1$. In this case, it is assumed that the applied magnetic field pulse during the optical probe pulse $O_1$ will be a 2π pulse or pulse of duration 2πn where n is an integer such that the spin is returned to its original angle. Then, after an applied magnetic π/2 pulse in the z-direction and another free precession period, a magnetic field pulse along the y-axis is simultaneously applied with an optical probe pulse $O_2$. Demodulation of the probe signal by cos ($B_{P,2} \gamma$ t) yields information about $P_z$ and thereby the y-component of the magnetic field B, i.e., $B_y$ from the first free precession period and the x-component of the magnetic field B, i.e., $B_x$ from the second free precession period. Subtracting the demodulated signals, i.e., signal $O_2 \cos(B_{P,2} \gamma t)$ from $O_1 \cos(B_{P,1} \gamma t)$, using an appropriate scale factor to account for the signal decay will yield information uniquely about B. Demodulating the second optical probe pulse $O_2$ signal $b_y \sin(B_{P,2} \gamma t)$ will yield information about $P_x$ and thereby an additional measurement of the z-component of the magnetic field B, i.e., $B_z$.

It should be noted that as FIGS. 11A and 11B make clear, neither the applied magnetic π/2 pulses nor the applied magnetic π pulses are limited to a single direction of the applied magnetic field. Instead, applied magnetic pulses along different axial directions can be combined within the same measurement cycle.

Many other possible measurement sequences can be devised in which each optical probe pulse being used to measure a polarization-vector component is followed by an applied magnetic 7C pulse paired with a subsequent optical probe pulse that measures the negative of the same polarization-vector component. The benefit of such a scheme is that subtracting the two measurements can eliminate common-mode error, which, in turn, can suppress noise due to laser drift and the like. In principle, an arbitrary number of applied magnetic π pulses and an arbitrary number of measurements can be included in each measurement cycle, limited only by the length of the cycle. The total number of applied magnetic π/2 pulses that can be included in each measurement cycle is also arbitrary, in principle.

Returning again to (I) and the measurement cycle illustrated in FIG. 2, but including the transverse relaxation time of the atomic spin polarization $T_2$, the polarization component $P_z$ immediately following the initial magnetic π/2 pulse applied in the y-direction is given by:

$$P_z(t) = P_0 e^{-t/T_2} \sin[\theta_s] = P_0 e^{-t/T_2} \sin[\gamma(P) B_y t]. \quad (V)$$

Assuming a short applied magnetic π pulse and a constant gyromagnetic ratio, the signal S after demodulation is given by:

$$S = -\frac{1}{\Delta T} \int_0^{\Delta T} P_0 e^{-t/T_2} \sin[\gamma B_y t] dt \approx \quad (VI)$$

$$P_0 \frac{(T_2 - e^{-\Delta t/T_2}(T_2 + \Delta T))}{\Delta T} \frac{T_2 B_y \cdot \gamma}{(T_2 B_y \cdot \gamma)^2 + 1} \approx$$

$$P_0 \frac{(T_2 - e^{-\Delta t/T_2}(T_2 + \Delta T))}{\Delta T} T_2 B_y \cdot \gamma,$$

where $\Delta T$ is the time from the end of a first applied magnetic π/2 pulse to the start of the next optical pump pulse. In going from the first to the second line of (VI) the small angle approximation is applied, and in going from the second to the third line, $(T_2 B_y \cdot \gamma)^2$ is assumed to be much less than 1 and is eliminated. Equation (VI) thus shows that the signal S after demodulation is linear with respect to small changes in the ambient magnetic field component along y-direction, i.e., $B_y$.

Figure 12A:
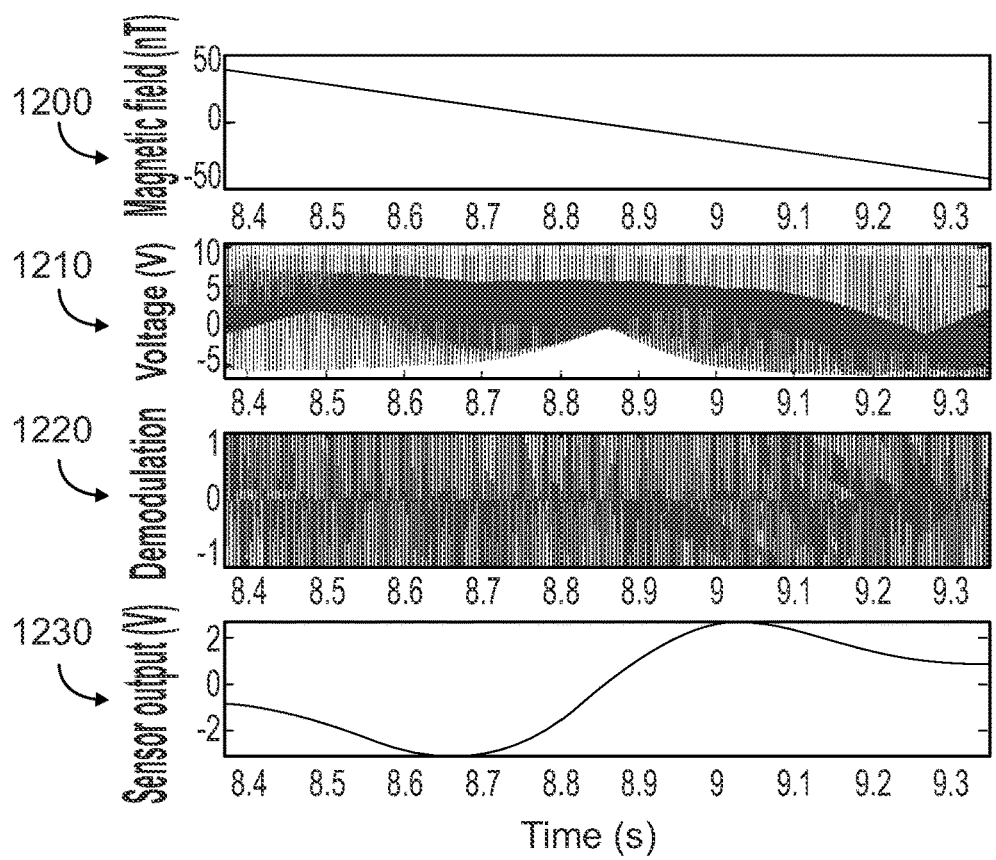
FIGS. 12A and 12B, an expanded portion of FIG. 12A, illustrate experimental results for an atomic magnetometer in accordance with at least one embodiment of the present invention.
Figure 12B:
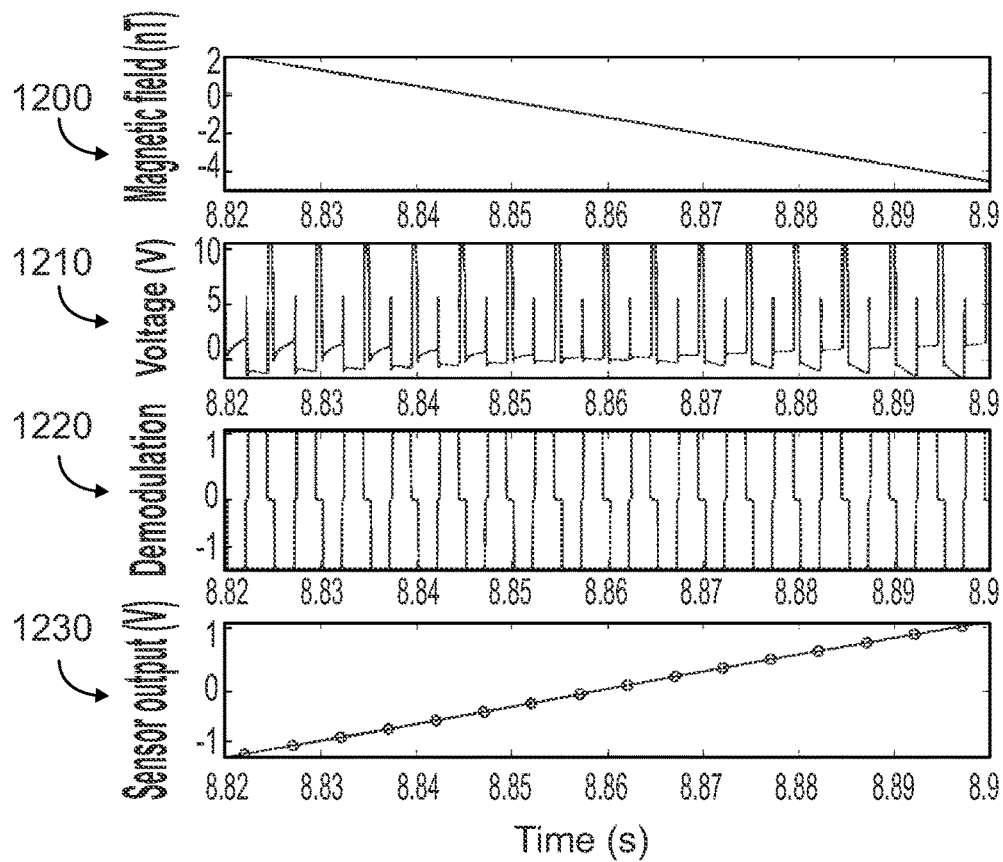

FIGS. 12A and 12B, an expanded portion of FIG. 12A, illustrate experimental results for an atomic magnetometer in accordance with at least one embodiment of the present invention that employs the measurement cycle illustrated in FIG. 2. Traces 1200, 1210, 1220, and 1230 correspond to a linear sweep of an ambient magnetic field $B_y$, the measured voltage output of the photodetectors, the demodulation waveform, and the sensor output, respectively. FIG. 12B is an expanded portion of FIG. 12A about the point where the ambient magnetic field crosses the point of zero field at t≈8.85 s. As can be observed in trace 1210, the output of the photodetector in the first half of a measurement cycle is greater than in the second half of a measurement cycle for a positive ambient magnetic field, while the output of the photodetector, which is negative in the first half of a measurement cycle, is less than in the second half of the measurement cycle for a negative ambient magnetic field, subject to a slight negative ambient magnetic field offset. As can be observed in trace 1230, the sensor output S goes through one or more maxima and minima corresponding to the dispersive curve given by (VI). As illustrated by trace 1230, the sensor output S is linear for an ambient magnetic field range of roughly±5 nT, giving a direct indication of the value of $B_y$ in that range. The experimental results illustrated in FIGS. 12A and 12B correspond to an atomic magnetometer employing collinear pump and probe light beams and an applied magnetic waveform corresponding to FIG. 2.

Figure 13A:
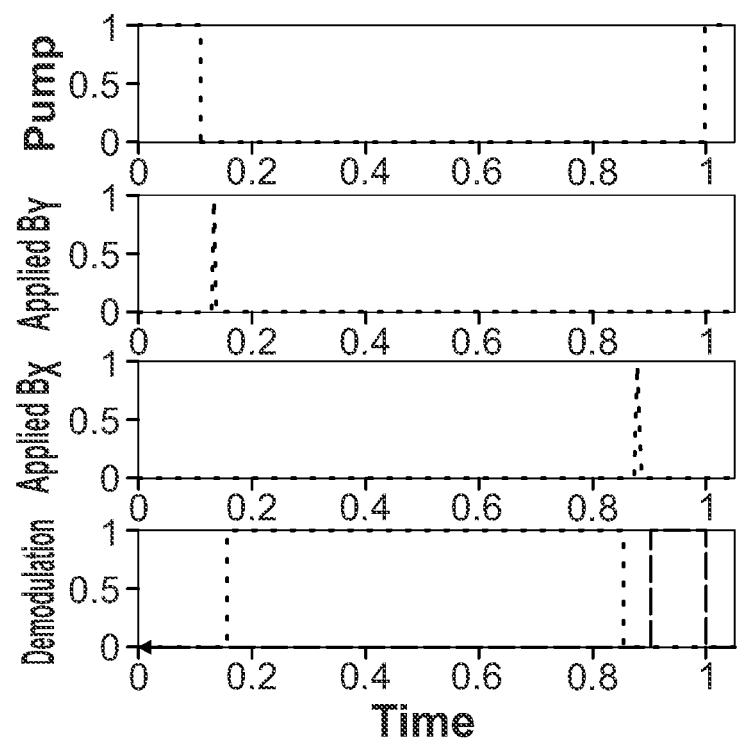
FIG. 13A is a timing diagram for a simulated 2D measurement cycle in accordance with at least one embodiment of the present invention.
Figure 13B:
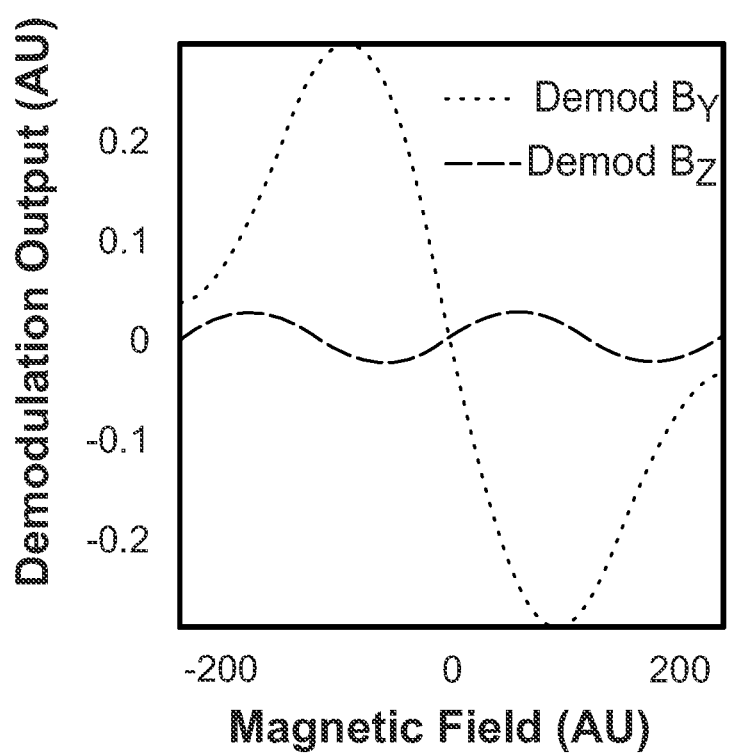
FIG. 13B is a simulated demodulation output for the 2D measurement cycle illustrated in FIG. 13A.

FIG. 13A illustrates a timing diagram for a 2D measurement cycle for measuring the y- and z- components of an ambient magnetic field B, i.e., measurements of $P_z$ and $P_y$ to thereby determine $B_y$ and $B_z$, respectively, when employing collinear pump and optical probe beams in the z-direction. In contrast to FIGS. 11A-11E, where the optical probe laser is pulsed, the optical probe laser is on continuously in the embodiment illustrated in FIGS. 13A and 13B, while still yielding measurements of more than one ambient magnetic field component. As illustrated in FIG. 13A, measuring only the y- and z- components of an ambient magnetic field, i.e., $B_y$ and $B_z$, requires two sets of coils applying y- and x-oriented magnetic π/2 pulses. As further illustrated in FIGS. 13A and 13B, the given demodulation waveform for the y- and z- components of the ambient magnetic field produce corresponding sensor outputs that are greater for $B_y$ than for $B_z$. This difference is due to $P_z$ being continuously measured through the free precession of the spin polarization, while after the free precession period, $P_y$ is rotated into the z-direction so it can be briefly measured. If the second measurement period is too long, the y-component of the ambient magnetic field will cause precession during the measurement giving rise to the second measurement containing information about both $B_y$ and $B_z$.

In an effort to improve sensitivity, various possible sources of noise in the overall atomic magnetometer were examined. One source of noise is the pump laser as variations in the optical pump pulses can cause corresponding fluctuations in the atomic polarization. Variations in the optical pump pulses may be due to the laser itself, as its output may be a function of temperature, which can vary as the laser heats up during operation. The circuit used to drive the pump laser, i.e., the pulse drive circuit, may likewise cause variations in the optical pump pulses. This may, at least partially, be overcome through the use of a CW pump laser in conjunction with an acousto-optic modulator (AOM) to generate the desired optical pump pulses. Similar noise sources may be found in the probe laser and optical probe pulses.

The applied magnetic pulses may also create noise that limits the ultimate sensitivity of the atomic magnetometer. For example, variations in the current used to drive the coils generating the applied magnetic pulses can create noise. It has been determined that keeping the "area" under the curve in each of the applied magnetic pulses constant is more critical than the absolute shape of each applied magnetic pulse. Jitter in the timing of the applied magnetic pulses will likewise contribute to the overall noise in the atomic magnetometer.

Yet another source of noise in the atomic magnetometer is due to fluctuating "hot spots" created by the optical pump pulses within the atomic vapor when using a multimode diode laser to pump the atoms. These hot spots within the atomic vapor can be reduced through the use of a diffuser, which creates a more uniform intensity profile across the optical pump beam. A 0.5° or 1.0° diffuser placed approximately 10 cm away from the vapor cell was sufficient to create a more stable atomic spin polarization throughout the atomic vapor, thereby significantly reducing the noise floor in the atomic magnetometer.

The invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

The invention claimed is:

1. A method of measuring an ambient magnetic field B with an atomic magnetometer of the kind in which a probe light beam having a probe axis probes a polarization vector P of an atomic population periodically pumped by an optical pump pulse along a pump axis and confined within a vapor cell, wherein each of one or more measurement cycles comprises:
    preparing the polarization vector P in an initial state with the optical pump pulse;
    applying a magnetic waveform along at least an axis orthogonal to at least one of the pump axis or the probe axis to the vapor cell so as to rotate the direction of the polarization vector P, the magnetic waveform including at least one of a magnetic $\pi/2$ pulse or a magnetic $\pi$ pulse;
    subjecting the vapor cell to the ambient magnetic field B, whereby the polarization vector P is rotated by Larmor precession; and
    making at least one projection measurement of a projection of the thus Larmor-rotated polarization vector P onto the probe axis, each of the at least one projection measurements being made during or after applying the magnetic waveform.

2. The method of claim 1, wherein the pump axis and the probe axis are collinear.

3. The method of claim 2, wherein:
    applying the magnetic waveform includes applying a magnetic $\pi/2$ pulse to the vapor cell after preparing the polarization vector P in the initial state, the magnetic $\pi/2$ pulse rotating the polarization vector P by 90° about an axis orthogonal to the probe axis;
    a first of the at least one projection measurements is made after applying the magnetic $\pi/2$ pulse;
    applying the magnetic waveform further includes applying a magnetic $\pi$ pulse to the vapor cell after making the first of the at least one projection measurements, the magnetic $\pi$ pulse rotating the polarization vector P by 180° about the axis orthogonal to the probe axis, and a second of the at least one projection measurements is made after applying the magnetic 7C pulse.

4. The method of claim 2, wherein, in each measurement cycle after the polarization vector P is prepared in the initial state:
    the polarization vector P is rotated by applying a first magnetic $\pi/2$ pulse as part of applying the magnetic waveform, the first magnetic $\pi/2$ pulse is applied so as to rotate the polarization vector P through 90° about an axis orthogonal to the probe axis;
    a first projection measurement of the polarization vector P onto the probe axis is made after applying the first magnetic $\pi/2$ pulse as part of making at least one projection measurement;
    P is further rotated by a second magnetic $\pi/2$ pulse as part of applying a magnetic waveform, the second magnetic $\pi/2$ pulse is applied in a direction collinear with the probe axis; and
    at least one further projection measurement of the polarization vector P onto the probe axis is made as part of making at least one projection measurement, the at least one further projection measurement is made after applying the second magnetic $\pi/2$ pulse.

5. The method of claim 1, wherein:
    the pump axis is orthogonal to the probe axis;
    a first of the at least one projection measurements is made;
    applying the magnetic waveform includes applying a magnetic $\pi$ pulse to the vapor cell after the first of the at least one projection measurements is made, the magnetic $\pi$ pulse rotating the polarization vector P by 180° about an axis orthogonal to the probe axis; and
    a second of the at least one projection measurements is made after applying the magnetic 7C pulse.

6. The method of claim 1, wherein applying the magnetic waveform includes applying a magnetic $\pi/2$ pulse to the vapor cell before pumping the atomic population with the optical pump beam, the magnetic $\pi/2$ pulse aligning a residual atomic polarization with the pump axis.

7. The method of claim 1, wherein the at least one projection measurement is one of a continuous measurement made by the probe light beam in continuous operation or a discrete measurement made $b_y$ the probe light beam in pulsed operation.

8. The method of claim 1, further comprising numerically processing the at least one projection measurement to obtain values for one of (i) one component of the ambient magnetic field B along the pump axis, (ii) two orthogonal components of the ambient magnetic field B, or (iii) three orthogonal components of the ambient magnetic field B.

9. An atomic magnetometer comprising:
    a vapor cell adapted to confine an atomic population having a polarization vector P, the vapor cell adapted to be subjected to an ambient magnetic field B, whereby the polarization vector P is rotated by Larmor precession due to the ambient magnetic field B;
    a pump laser adapted to generate an optical pump pulse, the optical pump pulse adapted to periodically pump the atomic population of an alkali metal vapor, the optical pump pulse having a pump axis, the optical pump pulse adapted to prepare the polarization vector P in an initial state;
    a probe laser adapted to generate a probe light beam, the probe light beam along a probe axis, the probe light beam adapted to probe the polarization vector P of the atomic population of the alkali metal vapor;
    one or more coils adapted to apply a magnetic waveform to the vapor cell, the magnetic waveform applied along at least an axis orthogonal to at least one of the pump axis or the probe axis after generation of the optical pump pulse, the magnetic waveform adapted to rotate the direction of the polarization vector P, the magnetic waveform including at least one of a magnetic $\pi/2$ pulse or a magnetic $\pi$ pulse; and a sensor adapted to make at least one projection measurement of a projection of the Larmor-rotated polarization vector P onto the probe axis, each of the at least one projection measurements being made during or after applying the magnetic waveform.

10. The atomic magnetometer of claim 9, wherein the pump axis and the probe axis are collinear.

11. The atomic magnetometer of claim 10, wherein:

the magnetic waveform includes a magnetic $\pi/2$ pulse applied to the vapor cell after preparing the polarization vector P in the initial state, the magnetic $\pi/2$ pulse rotating the polarization vector P by 90° about an axis orthogonal to the probe axis;

a first of the at least one projection measurements is made after applying the magnetic $\pi/2$ pulse;

the magnetic waveform further includes a magnetic $\pi$ pulse applied to the vapor cell after making the first of the at least one projection measurements, the magnetic $\pi$ pulse rotating the polarization vector P by 180° about the axis orthogonal to the probe axis, and a second of the at least one projection measurements is made after applying the magnetic 7C pulse.

12. The atomic magnetometer of claim 10, wherein:

the magnetic waveform includes a first magnetic $\pi/2$ pulse, the first magnetic $\pi/2$ pulse adapted to rotate the polarization vector P through 90° about an axis orthogonal to the probe axis;

a first of the at least one projection measurements is made after applying the first magnetic $\pi/2$ pulse;

the magnetic waveform further includes a second magnetic $\pi/2$ pulse, the second magnetic $\pi/2$ pulse is applied in a direction collinear with the probe axis; and the at least one projection measurement includes at least one further projection measurement, the at least one further projection measurement is made after applying the second magnetic $\pi/2$ pulse.

13. The atomic magnetometer of claim 9, wherein:

the pump axis is orthogonal to the probe axis;

the sensor is adapted to make a first of the at least one projection measurement;

the one or more coils are adapted to apply the magnetic waveform including a magnetic $\pi$ pulse after the first of the at least one projection measurements is made, the magnetic $\pi$ pulse rotating the polarization vector P by 180° about an axis orthogonal to the probe axis; and the sensor is adapted to make a second of the at least one projection measurement after the magnetic $\pi$ pulse is applied.

14. The atomic magnetometer of claim 9, wherein the one or more coils are adapted to apply the magnetic waveform including a magnetic $\pi/2$ pulse to the vapor cell before the pump laser generates the optical pump pulse, the magnetic $\pi/2$ pulse aligning a residual atomic polarization with the pump axis.

15. The atomic magnetometer of claim 9, wherein the at least one projection measurement is one of a continuous measurement made by the probe light beam in continuous operation or a discrete measurement made by the probe light beam in pulsed operation.

16. The atomic magnetometer of claim 9, further comprising a numerical processor adapted to numerically process the at least one projection measurement to obtain values for one of (i) one component of the ambient magnetic field orthogonal to the pump axis, (ii) two orthogonal components of the ambient magnetic field B, or (iii) three orthogonal components of the ambient magnetic field B.

* * * * *